United States Patent
Jee et al.

(10) Patent No.: US 8,697,519 B2
(45) Date of Patent: Apr. 15, 2014

(54) METHOD OF MANUFACTURING A SEMICONDUCTOR DEVICE WHICH INCLUDES FORMING A SILICON LAYER WITHOUT VOID AND CUTTING ON A SILICON MONOLAYER

(75) Inventors: Junggeun Jee, Seoul (KR); Woosung Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/567,320

(22) Filed: Aug. 6, 2012

(65) Prior Publication Data
US 2013/0095622 A1 Apr. 18, 2013

(30) Foreign Application Priority Data
Oct. 18, 2011 (KR) .................. 10-2011-0106459

(51) Int. Cl.
*H01L 21/336* (2006.01)
(52) U.S. Cl.
USPC ................................. 438/270; 257/E21.41
(58) Field of Classification Search
USPC .................... 438/270; 257/E21.41
See application file for complete search history.

(56) References Cited

U.S. PATENT DOCUMENTS

| 5,153,813 | A | * | 10/1992 | Oehrlein et al. ............... 361/313 |
| 5,160,987 | A | * | 11/1992 | Pricer et al. ................... 257/307 |
| 6,027,968 | A | * | 2/2000 | Nguyen et al. ................ 438/254 |
| 6,624,018 | B1 | * | 9/2003 | Yu et al. ........................ 438/239 |
| 7,476,614 | B2 | * | 1/2009 | Kwak et al. .................... 438/639 |
| 7,994,011 | B2 | * | 8/2011 | Park et al. ..................... 438/287 |
| 8,492,874 | B2 | * | 7/2013 | Lan et al. ...................... 257/534 |
| 2011/0291175 | A1 | | 12/2011 | Jee et al. |

FOREIGN PATENT DOCUMENTS

| JP | 2009-267285 | 11/2009 |
| KR | 1020050066188 | 6/2005 |
| KR | 1020070055899 | 5/2007 |
| KR | 1020100079797 | 7/2010 |
| KR | 20110129079 | 12/2011 |
| WO | 2007061273 | 5/2007 |

* cited by examiner

*Primary Examiner* — William D Coleman
(74) *Attorney, Agent, or Firm* — F. Chau & Associates, LLC

(57) ABSTRACT

Methods of manufacturing a semiconductor device are provided. Patterns having a recess region defined therebetween are formed on a substrate, and then a silicon precursor having an organic ligand is provided on the substrate to absorb silicon on sidewalls and a bottom surface of the recess region to form a silicon monolayer on the patterns having the recess region defined therebetween. A silicon layer without void and cutting is formed on the silicon monolayer.

20 Claims, 25 Drawing Sheets

US 8,697,519 B2

METHOD OF MANUFACTURING A SEMICONDUCTOR DEVICE WHICH INCLUDES FORMING A SILICON LAYER WITHOUT VOID AND CUTTING ON A SILICON MONOLAYER

CROSS-REFERENCE TO RELATED APPLICATIONS

This U.S. non-provisional patent application claims priority under 35 U.S.C. §119 to Korean Patent Application No. 10-2011-0106459, filed on Oct. 18, 2011, the disclosure of which is hereby incorporated by reference herein in its entirety.

BACKGROUND

The present disclosure relates to methods of manufacturing a semiconductor device and, more particularly, to methods of manufacturing a semiconductor device including a silicon layer formed in a recess region.

As the semiconductor industry becomes more developed, high integration, low power consumption, and/or high speed of semiconductor devices have been increasingly demanded. Line widths and spaces of various patterns constituting the semiconductor devices have been reduced for satisfying the various characteristics of the semiconductor devices. In other words, as the semiconductor devices are becoming more highly integrated, an aspect ratio between the patterns are also being increased. Thus, as a result, the characteristics of the semiconductor devices may be deteriorated or operational performance difficulties of the semiconductor devices may be caused.

SUMMARY

Exemplary embodiments of the inventive concept may provide methods of manufacturing a semiconductor device capable of filling a recess region between narrow patterns with a silicon layer without void and cutting.

In an exemplary embodiment of the present invention, a method of manufacturing a semiconductor device may include: forming a plurality of patterns having a recess region defined therebetween on a substrate, forming a silicon monolayer on the patterns having the recess region defined therebetween by providing a silicon precursor having an organic ligand on the substrate to absorb silicon on sidewalls and a bottom surface of the recess region and forming a silicon layer without void and cutting on the silicon monolayer.

In an exemplary embodiment, a space between the sidewalls of the recess region may be no greater than about 10 nm.

In an embodiment, the silicon precursor having the organic ligand may be one of $H_3SiN(CH(CH_3)_2)_2$, $H_2Si(N(C_2H_5)_2)_2$, $H_2Si(NHC(CH_3)_3)_2$, or $H_2Si(N(C_2H_5)(CH_3))_2$.

In an embodiment, the forming of the silicon monolayer may be performed at a substrate temperature of no greater than about 500 degrees Celsius.

In an embodiment, the forming of the patterns may include: forming a plurality of device isolation members on the substrate to define a plurality of active regions, sequentially forming a tunnel insulating layer and a floating gate on each of the active regions. The top surfaces of the device isolation members are lower than top surfaces of the floating gates. The method further includes forming an intergate insulating layer on the floating gates, and the intergate insulating layer extends onto the top surface of the device isolation members.

In an embodiment, the recess region may be provided between the floating gates, and the silicon layer without void and cutting may fill the recess region between the floating gates.

In an embodiment, the intergate insulating layer may have an opening exposing one of the floating gates, the silicon monolayer may be formed along a profile of the opening, and the silicon layer may be formed to fill the opening without void and cutting.

In an embodiment, the forming of the patterns may include etching the substrate to form the recess region in the substrate, and the silicon monolayer may be formed along a profile of the sidewalls and the bottom surface of the recess region.

In an embodiment, the silicon layer may fill a lower portion of the recess region. In this case, the method may further include: injecting dopant ions into regions of the substrate divided by the recess region to form source/drain regions.

In an embodiment, the forming of the patterns may further include: forming an undercut region extending from the recess region in a direction parallel to a top surface of the substrate. In this case, the silicon monolayer and the silicon layer may be formed along a profile of sidewalls of the recess region and the undercut region.

In an exemplary embodiment of the present invention, a method of manufacturing a semiconductor device may include: alternately stacking a plurality of first material layers and a plurality of second material layers on a substrate, forming a plurality of channel holes penetrating the first material layers and the second material layers, the channel holes exposing the substrate, forming a first silicon monolayer along a profile of the exposed substrate and sidewalls of the channel holes by providing a silicon precursor having an organic ligand on the substrate to absorb silicon on the sidewalls of the channel holes and the exposed substrate and forming a first silicon layer without void and cutting on the first silicon monolayer to form a plurality of active pillars.

In an embodiment, the method may further include: etching the first material layers and the second material layers to form a groove between the channel holes, selectively removing the first material layers exposed by the groove to form undercut regions exposing the active pillars and top surfaces and bottom surfaces of the second material layers, the undercut regions extend from the groove toward the active pillars, forming a data storing layer on the exposed active pillars and the exposed top surfaces and bottom surfaces of the second material layers, forming a second silicon monolayer on the data storing layer by providing a silicon precursor having an organic ligand on the data storing layer to absorb silicon on a surface of the data storing layer and forming a second silicon layer without void and cutting on the second silicon monolayer to fill the undercut regions.

In an exemplary embodiment of the present invention, a method for manufacturing a semiconductor device is provided. The method includes forming a groove in a substrate extending in a direction parallel to a top surface of the substrate, thereby defining a plurality of regions in the substrate which are divided by the groove, forming an undercut region extending from a lower area of the groove in the direction parallel to the top surface of the substrate, forming a gate insulating layer on sidewalls of the groove and sidewalls and a bottom surface of the undercut region, forming a seed layer of a silicon monolayer on the gate insulating layer by providing a silicon precursor including an organic ligand on the gate insulating layer to absorb silicon on a surface of the gate insulating layer.

The method further includes forming a silicon layer on the seed layer, wherein the silicon layer grows from the seed layer of the silicon monolayer to fill the groove without void and cutting, removing a portion of the silicon layer and the seed layer in an upper portion of the groove, forming a capping layer in the upper portion of the groove and providing dopant ions into the regions of the substrate divided by the groove, thereby forming source/drain regions.

BRIEF DESCRIPTION OF THE DRAWINGS

Exemplary embodiments of the inventive concept can be understood in more detail from the following detailed description taken in conjunction with the attached drawings in which.

DETAILED DESCRIPTION OF EXEMPLARY EMBODIMENTS

Figure 1:
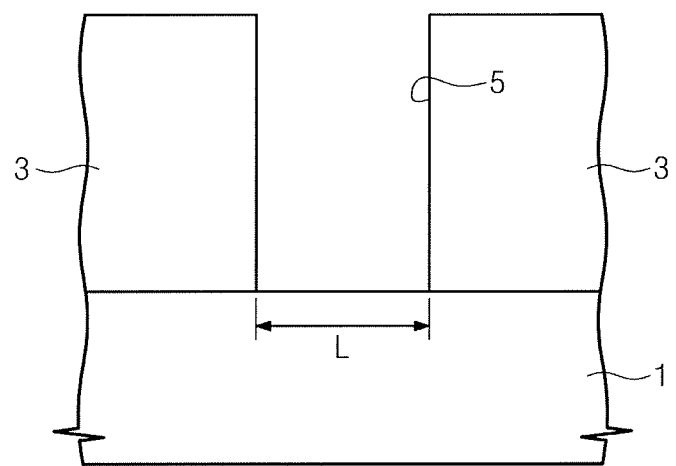
FIGS. 1 to 3 are cross-sectional views to explain an exemplary embodiment of the inventive concept.

Exemplary embodiments of the inventive concept will now be described more fully hereinafter with reference to the accompanying drawings, in which exemplary embodiments of the inventive concept are shown. In the drawings, embodiments of the inventive concept are not limited to the specific examples provided herein and may exaggerated for clarity.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The same reference numerals or the same reference designators denote the same elements throughout the specification.

Hereinafter, exemplary embodiments of the inventive concept will be described in more detail with reference to the drawings.

Figure 2:
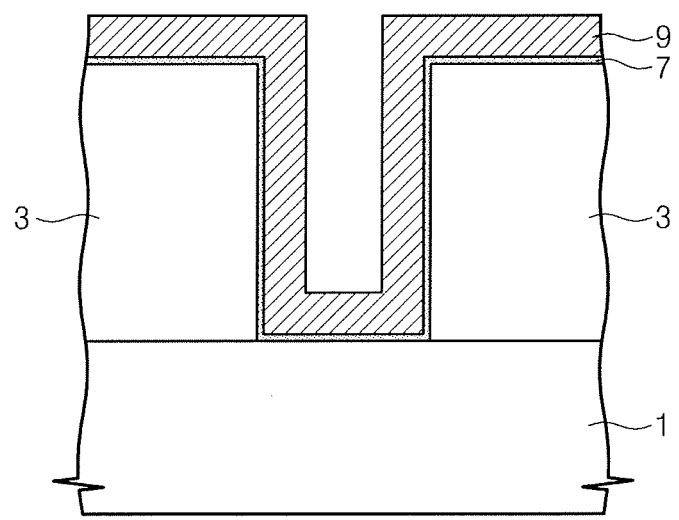
Figure 3:
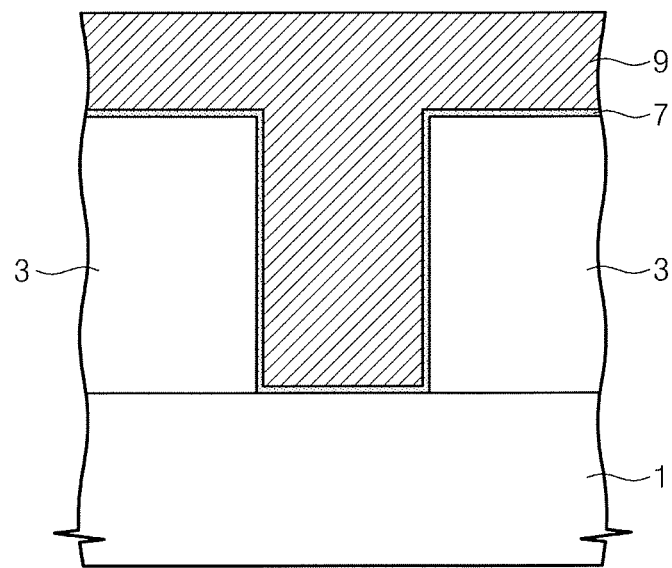
Figure 4:
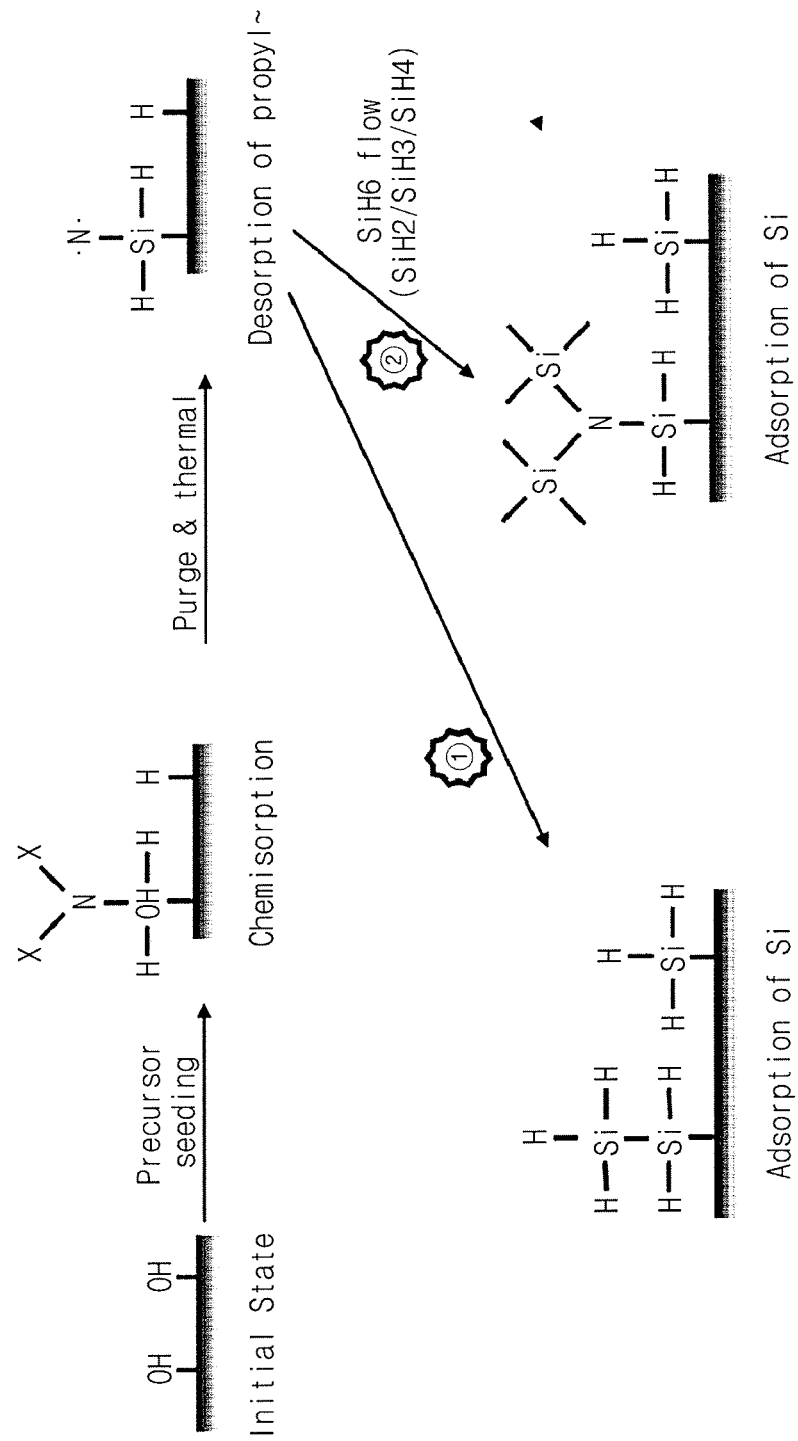
FIG. 4 is a conceptual diagram to explain an exemplary embodiment of the inventive concept.
Figure 5:
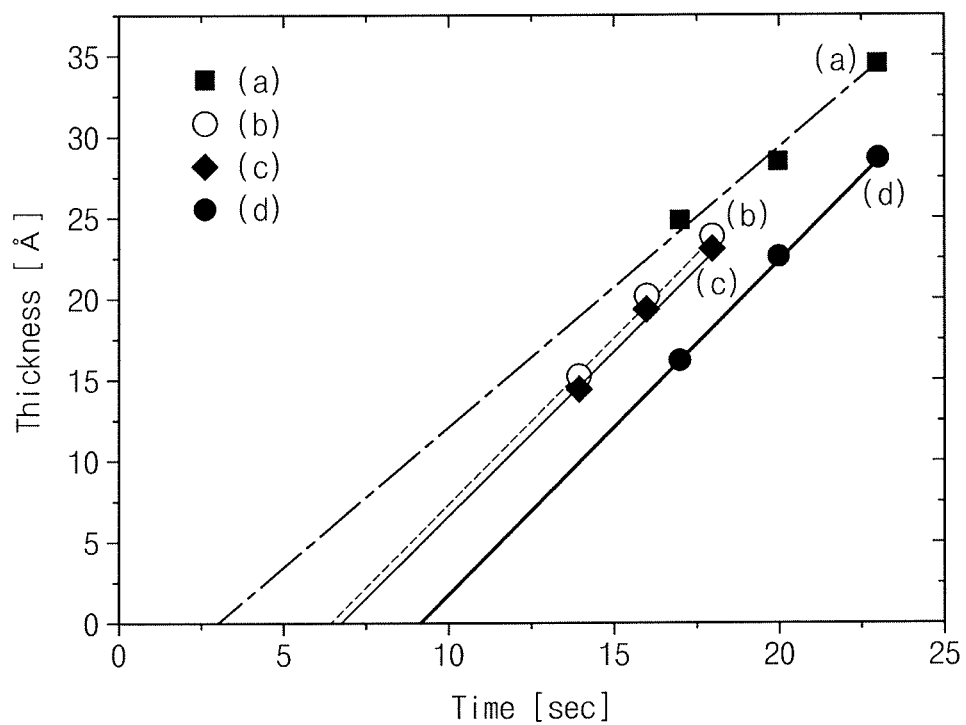
FIG. 5 is a graph illustrating the comparison of adsorption characteristics of silicon precursors according to an exemplary embodiment of the inventive concept.

FIGS. 1 to 3 are cross-sectional views to explain the inventive concept, FIG. 4 is a conceptual diagram to explain the inventive concept, and FIG. 5 is a graph illustrating the comparison of adsorption characteristics of silicon precursors according to an exemplary embodiment of the inventive concept.

Referring to FIG. 1, patterns 3 are formed on a substrate 1 to be adjacent to each other. The substrate 1 may include, for example, one selected from a group consisting of a single-crystalline silicon layer, a silicon on insulator (SOI), a silicon-germanium layer, a silicon layer on a silicon-germanium layer, a single-crystalline silicon layer on an insulating layer, and a poly silicon layer on an insulating layer. The substrate 1 may further include, for example, an insulating structure, a circuit structure, or an interconnection structure formed thereon.

The patterns 3 may be formed of, for example, an insulating material, a conductive material, metal, or a semiconductor material. The patterns 3 may be, for example, protruded portions of the substrate 1. A recess region 5 is provided between the patterns 3. A space L between the patterns 3 may be, for example, equal to or less than about 10 nm.

Referring to FIG. 2, a seed layer 7 is formed on the patterns 3 having the recess region 5. According to exemplary embodiments of the inventive concept, the seed layer 7 is formed of, for example, a silicon monolayer.

Referring to FIG. 4, a silicon precursor having an organic ligand is provided on the substrate 1 to adsorb silicon on sidewalls and a bottom surface of the recess region, thereby forming the silicon monolayer. The silicon precursor having the organic ligand may be, for example, DiIsoPropylAminoSilane ($H_3SiN(CH(CH_3)_2)_2$), BisDiEthylAminoSilane ($H_2Si(N(C_2H_5)_2)_2$), BisTertButylAminoSilane ($H_2Si(NHC(CH_3)_3)_2$), or BisEthylMethylAminoSilane ($H_2Si(N(C_2H_5)(CH_3))_2$). Chemisorption may be enhanced by the organic ligand of the silicon precursor, so that silicon atoms may be readily adsorbed on a surface of a base. Thus, the silicon atoms may not agglomerate together, such that the silicon monolayer can be formed on the surface. The above characteristic of the silicon precursor having the organic ligand is distinguished from general silicon precursors (e.g., $Si_2H_6$ and $SiH_4$) used in an atomic layer deposition. If the general silicon precursors are used, silicon atoms may agglomerate together. Thus, the silicon monolayer may be formed but a silicon thin layer may be deposited.

Referring to FIG. 5, an absorption time (e.g. an incubation time) of $H_3SiN(CH(CH_3)_2)_2$ is the shortest. Absorption times of $H_2Si(N(C_2H_5)_2)_2$, $H_2Si(NHC(CH_3)_3)_2$, $H_2Si(N(C_2H_5)(CH_3))_2$, $Si_2H_6$, and $SiH_4$ increase in the order named. Reference designators (a), (b), (c), and (d) of FIG. 5 correspond to $H_3SiN(CH(CH_3)_2)_2$, $H_2Si(N(C_2H_5)_2)_2$, $H_2Si(NHC(CH_3)_3)_2$, and $Si_2H_6$, respectively. $H_2Si(N(C_2H_5)_2)_2$ has an absorption time between those of the designators (c) and (d), and the absorption time of $SiH_4$ is the longest. The silicon precursor having the organic ligand, for example $H_3SiN(CH(CH_3)_2)_2$, $H_2Si(N(C_2H_5)_2)_2$, $H_2Si(NHC(CH_3)_3)_2$, or $H_2Si(N(C_2H_5)(CH_3))_2$, have more excellent absorption characteristic than the general silicon precursors, such as, for example, $Si_2H_6$, and $SiH_4$, used in the atomic layer deposition.

Due to the above reasons, the silicon monolayer can be more readily formed using the silicon precursors having the organic ligand according to exemplary embodiments of the inventive concept than the general silicon precursors used in the atomic layer deposition.

Referring to FIGS. 2 and 4 again, the seed layer 7 may be formed at, for example, a substrate temperature equal to or less than about 500 degrees Celsius, so that the absorbed silicon atoms may be heat-treated. A purge process may be performed after the providing of the silicon precursor. Residues including an organic material can be desorbed and removed by, for example, the heat-treatment and the purge process. Thereafter, a silicon layer 9 is formed on the seed layer 7 by a general silicon formation process such as, for example, an atomic layer deposition (ALD) process or a chemical vapor deposition (CVD) process. The silicon layer 9 may be formed through, for example, a process ① and a process ② of FIG. 4.

Referring to FIG. 3, the silicon layer 9 grows from the seed layer 7 of the silicon monolayer to fill the recess region without void and cutting. If a silicon seed layer is formed using general silicon precursors used in the atomic layer deposition, silicon atoms may agglomerate together to form a silicon thin layer, not the silicon monolayer, due to a poor absorption characteristic of the general silicon precursors. Thus, a void (or cutting) may be generated in a silicon layer formed on the silicon thin layer. For example, if the silicon layer is formed in a recess region having a space of about 10 nm or less, the above phenomenon (e.g. void or cutting) can be more intensified.

Figure 6:
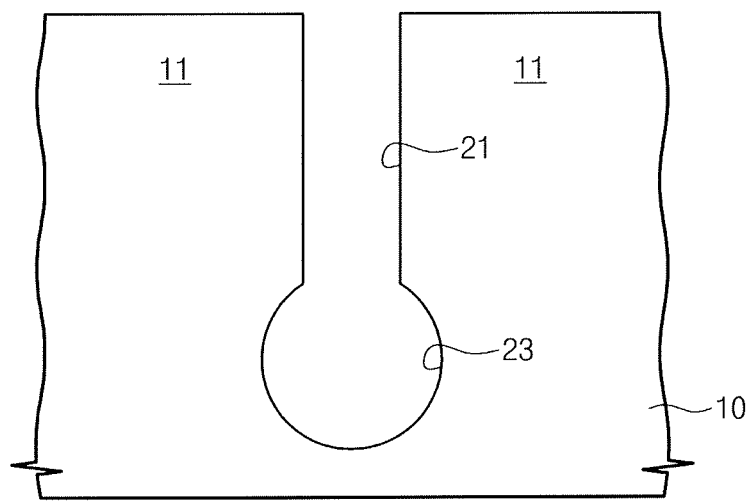
FIGS. 6 to 8 are cross-sectional views illustrating a method of manufacturing a semiconductor device according to an exemplary embodiment of the inventive concept.
Figure 7:
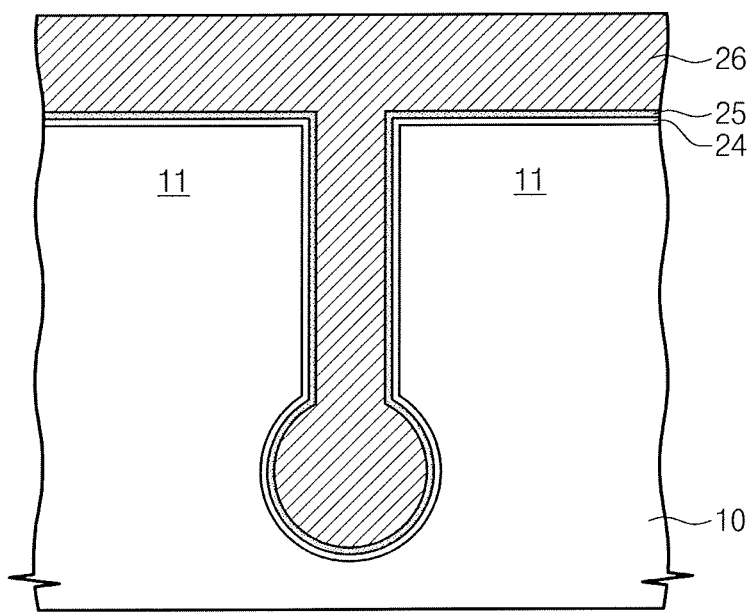
Figure 8:
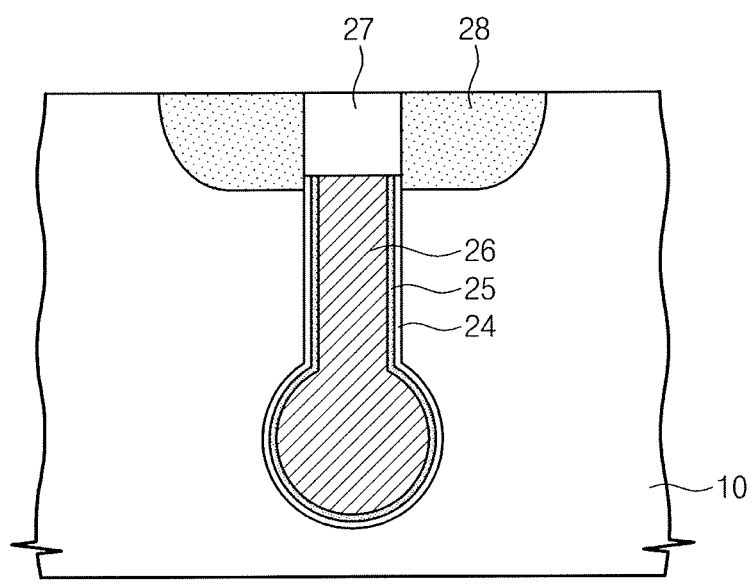

FIGS. 6 to 8 are cross-sectional views illustrating a method of manufacturing a semiconductor device according to an exemplary embodiment of the inventive concept.

Referring to FIG. 6, a groove 21 is formed in a substrate 10. The groove 21 may extend, for example, in a direction parallel to a top surface of the substrate 10. The groove 21 may correspond to the recess region 5 described with reference to FIG. 1. Regions 11 of the substrate divided by the groove 21 may correspond to the patterns 3 described with reference to FIG. 1.

The groove 21 may be formed by etching the substrate 10. Additionally, an undercut region 23 may be further formed. The undercut region 23 may extend from a lower region of the groove 21 in, for example, a direction parallel to the top surface of the substrate 10. The undercut region 23 may be formed by, for example, forming sidewall spacers (not shown) on sidewalls of the groove 21 and isotropically etching the substrate 10 exposed by the sidewall spacers. The sidewall spacers may be formed of, for example, silicon oxide or silicon nitride. The isotropic etching may be performed using an etching solution capable of selectively etching the substrate with respect to the sidewall spacers. After the undercut region 23 is formed, the sidewall spacers are removed. The undercut region 23 may correspond to the recess region 5 of FIG. 1 described above.

Referring to FIG. 7, a gate insulating layer 24 is formed on the sidewalls of the groove 21 and sidewalls and a bottom surface of the undercut region 23. The gate insulating layer 24 may be formed by performing, for example, a thermal oxidation process on the substrate 10.

A seed layer 25 and a silicon layer 26 are sequentially formed on the gate insulating layer 24 using, for example, the methods described with reference to FIGS. 2 to 4. As the silicon layer 26 is formed from the seed layer 25 of a silicon monolayer, the silicon layer 26 may be formed without void and cutting in the groove 21 having, for example, a narrow width. The silicon monolayer and the silicon layer may be formed, for example, along the sidewalls of the groove 21 and a profile of the undercut region 23.

Referring to FIG. 8, the silicon layer 26 and the seed layer 25 in an upper portion of the groove 21 may be removed. In other words, the silicon layer 26 may fill a lower part of the groove 21. A capping layer 27 may be formed in the upper portion of the groove 21. The capping layer 27 may be formed of, for example, a silicon oxide layer or a silicon nitride layer. Dopant ions may be injected into the regions 11 of the substrate divided by the groove 21, thereby forming source/drain regions 28. Thus, it is possible to form a buried channel transistor having a gate without void.

Figure 9:
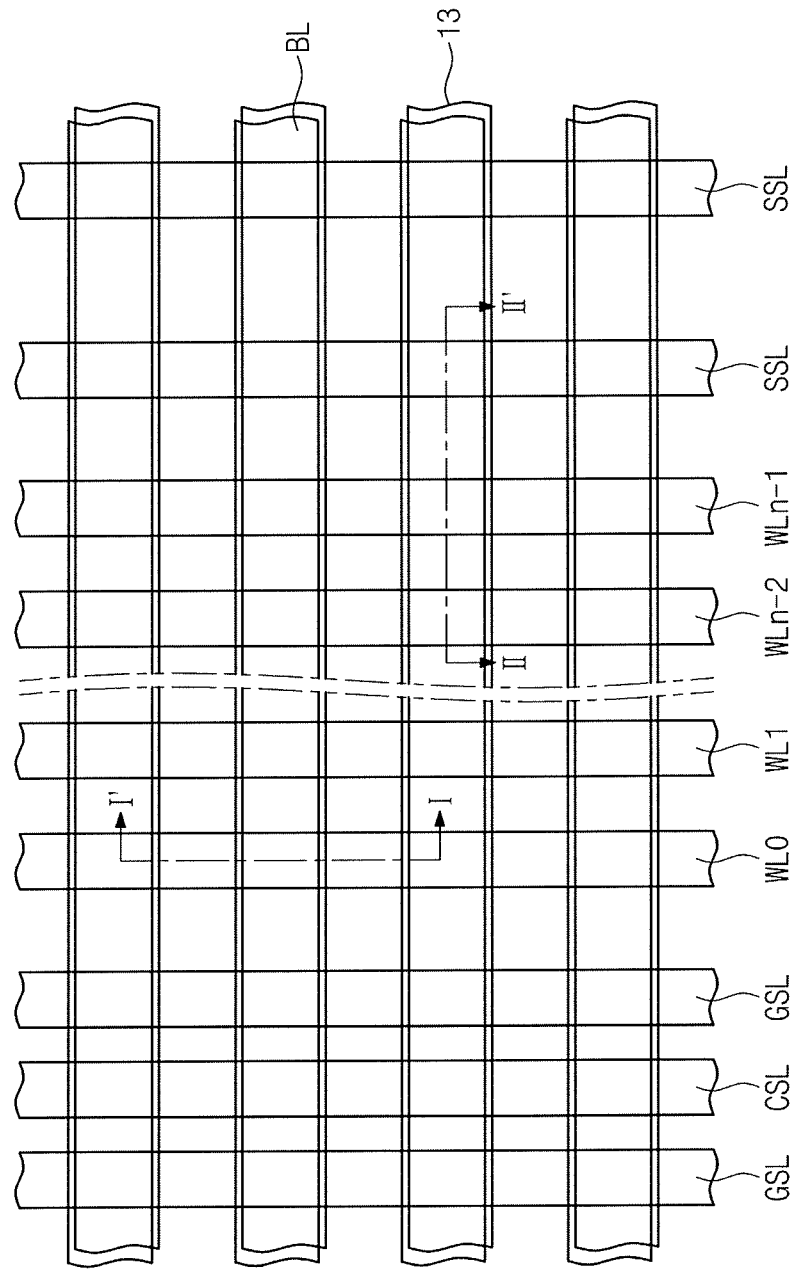
FIG. 9 is a layout of a semiconductor device according to an exemplary embodiment of the inventive concept.

FIG. 9 is a layout of a semiconductor device according to an exemplary embodiment of the inventive concept. As illustrated in FIG. 9, for example, a memory cell of the semiconductor device may be a NAND type non-volatile memory cell.

Referring to FIG. 9, active regions 13 may extend, for example, in parallel in a first direction. A string selection line SSL and a ground selection line GSL may, for example, cross over the active regions 13 in parallel to each other. A plurality of word lines WL0 to WLn−1 may, for example, cross over the active regions 13 between the string selection line SSL and the ground selection line GSL. The string selection line SSL, the ground selection line GSL, and the word lines WL0 to WLn−1 may, for example, extend in parallel in a second direction crossing the first direction. A common source line CSL may, for example, be provided between neighboring ground selection lines GSL to extend in the first direction. Bit lines BL extend, for example, in the second direction. The bit lines BL are connected to source/drain regions between neighboring string selection lines SSL through bit line contacts, respectively. The string selection line SSL, the word lines WL0 to WLn−1, and the ground selection line GSL may be included in a cell string group. A plurality of the cell string groups may be repeatedly arranged in, for example, mirror symmetry along the first direction.

FIGS. 10 to 16 are cross-sectional views taken along lines I-I' and II-II' of FIG. 9 to explain a method of manufacturing a semiconductor device according to an exemplary embodiment of the inventive concept.

Figure 10:
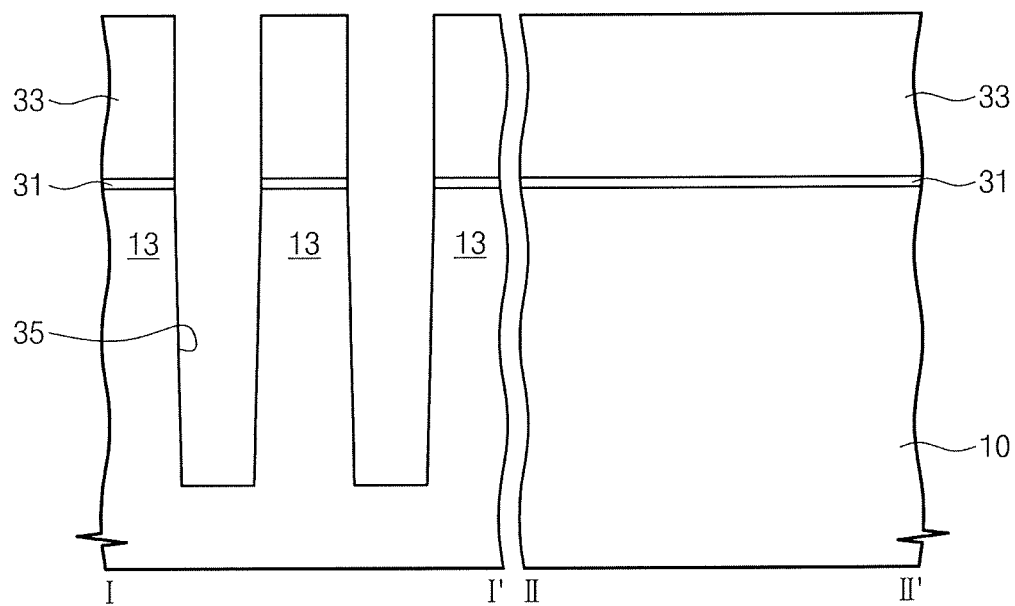
FIGS. 10 to 16 are cross-sectional views taken along lines I-I' and II-II' of FIG. 9 to explain a method of manufacturing a semiconductor device according to an exemplary embodiment of the inventive concept.

Referring to FIG. 10, mask patterns 33 may be formed on a substrate 10. The substrate 10 may include, for example, one selected from a group consisting of a single-crystalline silicon layer, a silicon on insulator (SOI), a silicon layer on a silicon-germanium (SiGe) layer, a single-crystalline silicon layer on an insulating layer, and a poly silicon layer on an insulating layer. For example, a buffer oxide layer 31 may further be formed between the substrate 10 and the mask patterns 33. The mask patterns 33 may include, for example, silicon nitride. The substrate 10 is etched using the mask patterns 33 as etch masks to form trenches 35. Each of the trenches 35 is provided between the mask patterns 33 adjacent to each other on the substrate 10. The trenches 35 define active regions 13. The trenches 35 extend, for example, in the first direction.

Figure 11:
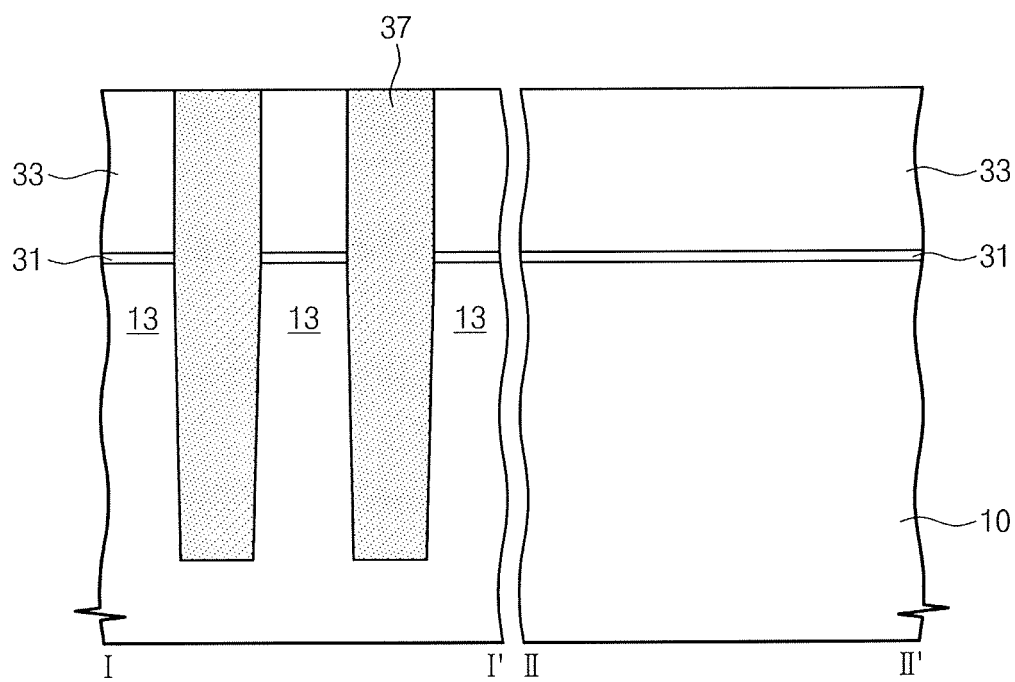

Referring to FIG. 11, a device isolation member 37 is formed in each of the trenches 35. The device isolation member 37 may be formed of an insulating material having an excellent gap-fill characteristic. The device isolation member 37 may include, for example, a silicon oxide layer. For example, the device isolation member 37 may be formed using Tonen Silazane (TOSZ). The TOSZ layer may be, for example, a polysilazane layer. The TOSZ layer may be formed by, for example, a spin coating method. In addition, an annealing process using, for example, $O_2$ and $H_2O$ may be performed to remove ammonia and hydrogen from the TOSZ layer. Thus, the TOSZ layer may become the silicon oxide layer. Alternatively, the device isolation member 37 may be formed of, for example, a spin on glass (SOG) oxide layer, a high density plasma (HDP) oxide layer, a undoped silicate glass (USG) oxide layer, and/or a tetraethyl orthosilicate (TEOS) oxide layer. The device isolation member 37 may be planarized by, for example, a chemical mechanical polishing (CMP) method. A top surface of the device isolation member 37 may be disposed at, for example, substantially the same level as a top surface of the mask patterns 33.

The device isolation member 37 may further include, for example, a liner insulating layer between the trench 35 and the silicon oxide layer. For example, the liner insulating layer may be formed on sidewalls and a bottom of the trench 35. For example, the liner insulating layer may include a silicon oxide layer formed on the sidewall and the bottom of the trench 35 by thermally oxidizing the substrate having the trench 35, and a silicon nitride layer (or a silicon oxynitride layer) on the silicon oxide layer. The silicon oxide layer of the liner insulating layer may cure damage caused by the etching process for the formation of the trench 35.

Figure 12:
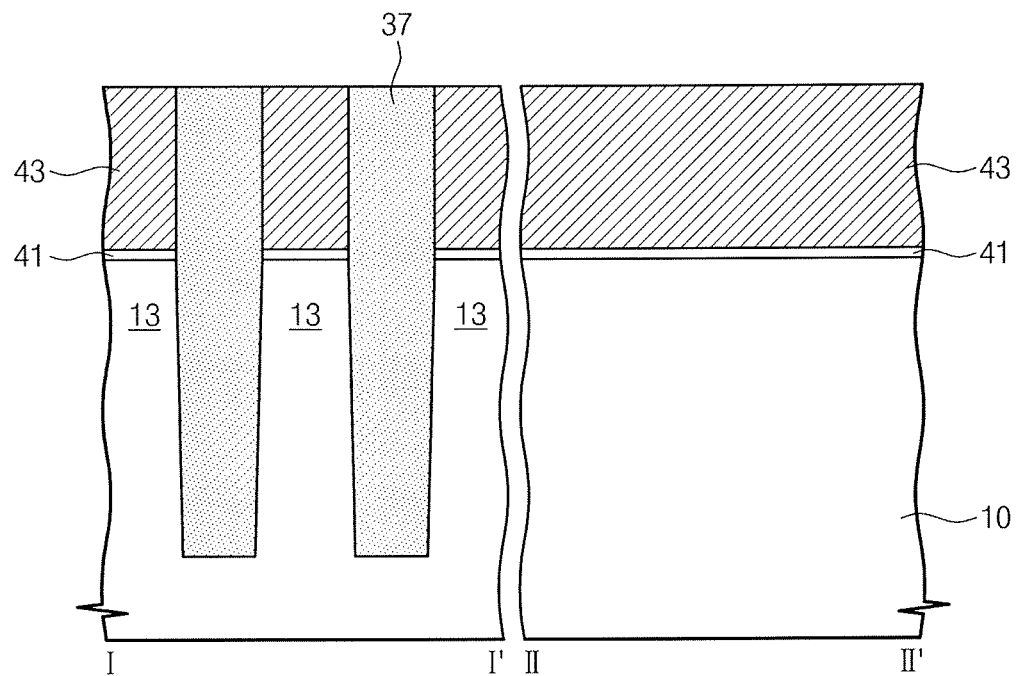

Referring to FIG. 12, the mask pattern 33 and the buffer oxide layer 31 are removed to expose the active regions 13. Even though not shown in the drawings, a portion of the device isolation member 37 adjacent to the mask patterns 33 may be removed, so that its width may be reduced. A tunnel insulating layer 41 and a plurality of floating gates 43 may be sequentially formed on each of the exposed active regions 13. The tunnel insulating layer 41 may be formed on top surfaces of the exposed active regions 13 by, for example, a thermal oxidation of the substrate 10. The floating gates 43 may be charge storing layers capable of storing charges. The floating gates 43 may be formed of, for example, polysilicon. The floating gates 43 may be planarized by, for example, a CMP method. Top surfaces of the floating gates 43 may be disposed at, for example, substantially the same level as the top surface of the device isolation member 37. In this case, a width of each of the floating gates 43 may be, for example, wider than a width of each of the active regions 13.

The floating gates 43 may be formed by, for example, a different method from the method described with reference to FIGS. 10 to 12. For example, in the process of FIG. 10, the buffer oxide layer 31 and the mask patterns 33 may be replaced with a tunnel insulating layer and floating gates. For example, the substrate 10 may be etched using the floating gates as etch masks to form the trenches 35. Thereafter, the device isolation member 37 may be formed, for example, as described with reference to FIG. 1, thereby forming the structure of FIG. 12. In this case, a width of each of the floating gates 43 may be, for example, substantially equal to a width of each of the active regions 13.

Figure 13:
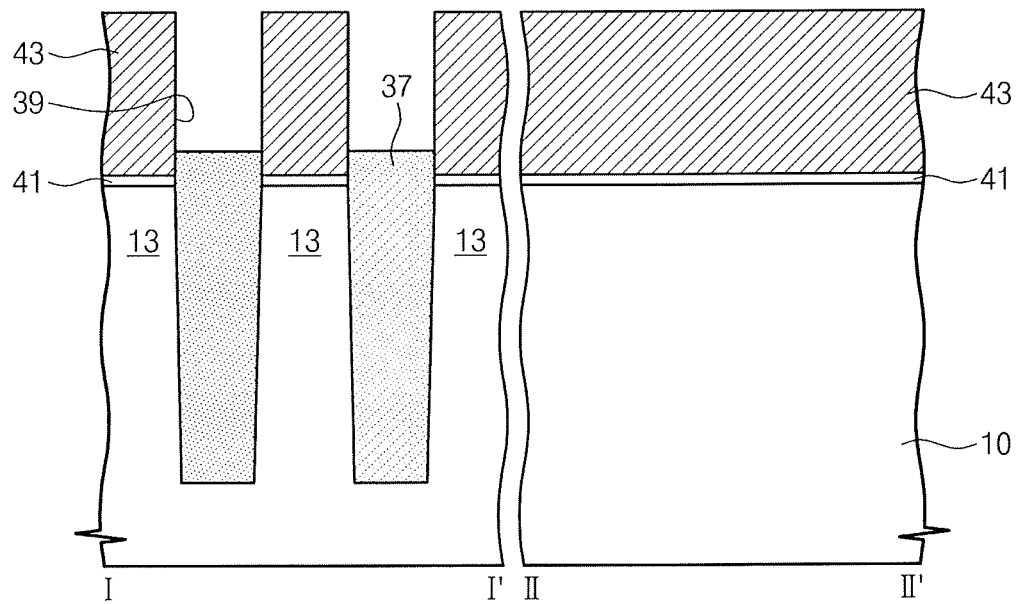

Referring to FIG. 13, an upper portion of the device isolation member 37 is removed, so that the device isolation member 37 is recessed. The recessing of the device isolation member 37 may be performed by, for example, an etch back process. Top surfaces of the device isolation members 37 may be, for example, lower than top surfaces of the floating gates 43. Thus, recess regions 39 are provided between the floating gates 43.

Figure 14:
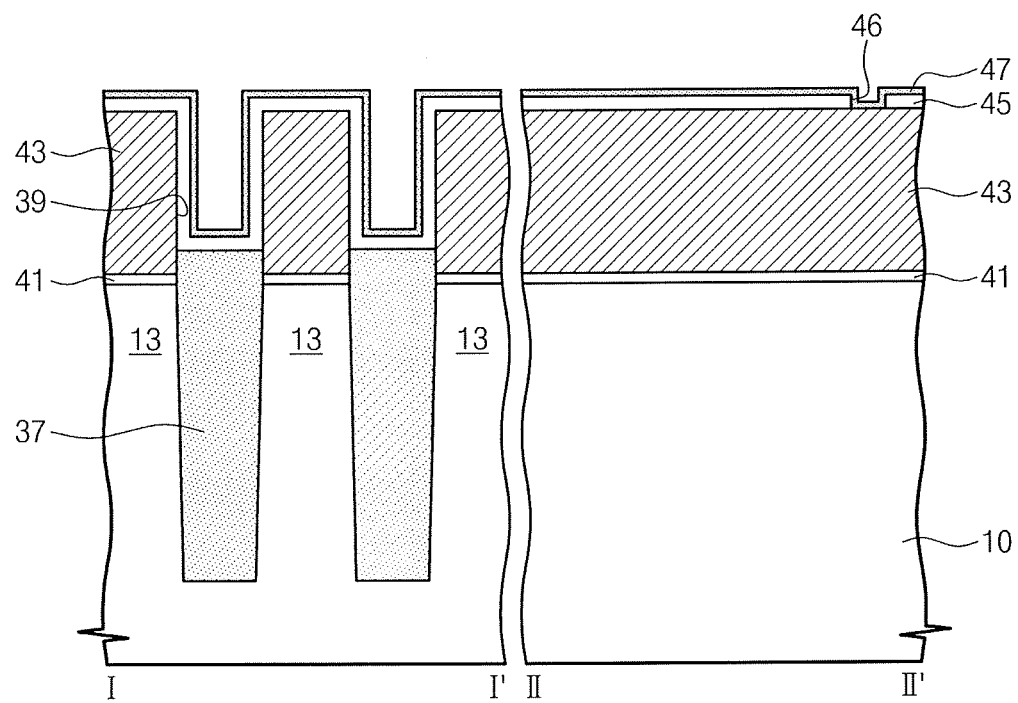
Figure 15:
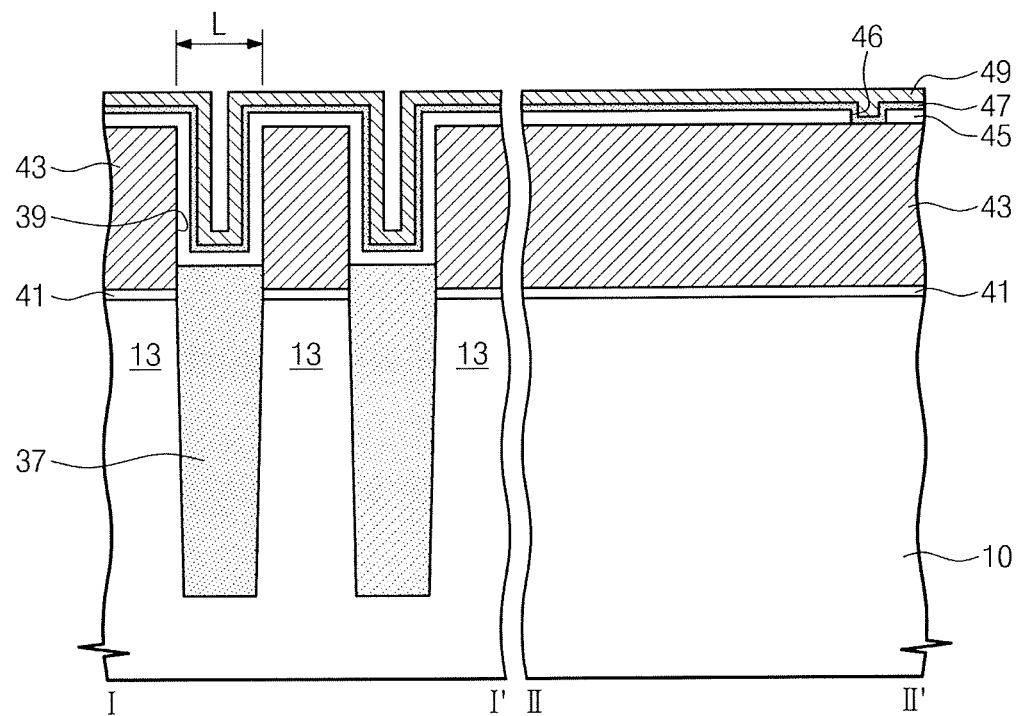

For example, referring to FIGS. 14 and 15, an intergate insulating layer 45 is formed on the floating gates 43. The intergate insulating layer 45 may include, for example, a material having a dielectric constant greater than the tunnel insulating layer 41. For example, the integrate insulating layer 45 may include at least one of an ONO layer (a stacked layer of a silicon oxide layer/a silicon nitride layer/a silicon oxide layer) and high-k dielectrics such as an aluminum oxide layer, a hafnium oxide layer, a hafnium-aluminum oxide layer, and a zirconium oxide layer. The intergate insulating layer 45 may extend onto the top surfaces of the device isolation members 37. The intergate insulating layer 45 may have, for example, openings 46 exposing the floating gates 43 in regions corresponding to the selection lines GSL and SSL.

A seed layer 47 and a silicon layer 49 are sequentially formed using, for example, the methods described with reference to FIGS. 2 to 4. As the silicon layer 49 is formed from the seed layer 47 of a silicon monolayer, the silicon layer 49 may be formed without void and cutting in recess region 39 and the opening 46 having narrow widths. The seed layer 47 is formed along a profile of the recess region 39 and a profile of the opening 46.

Figure 16:
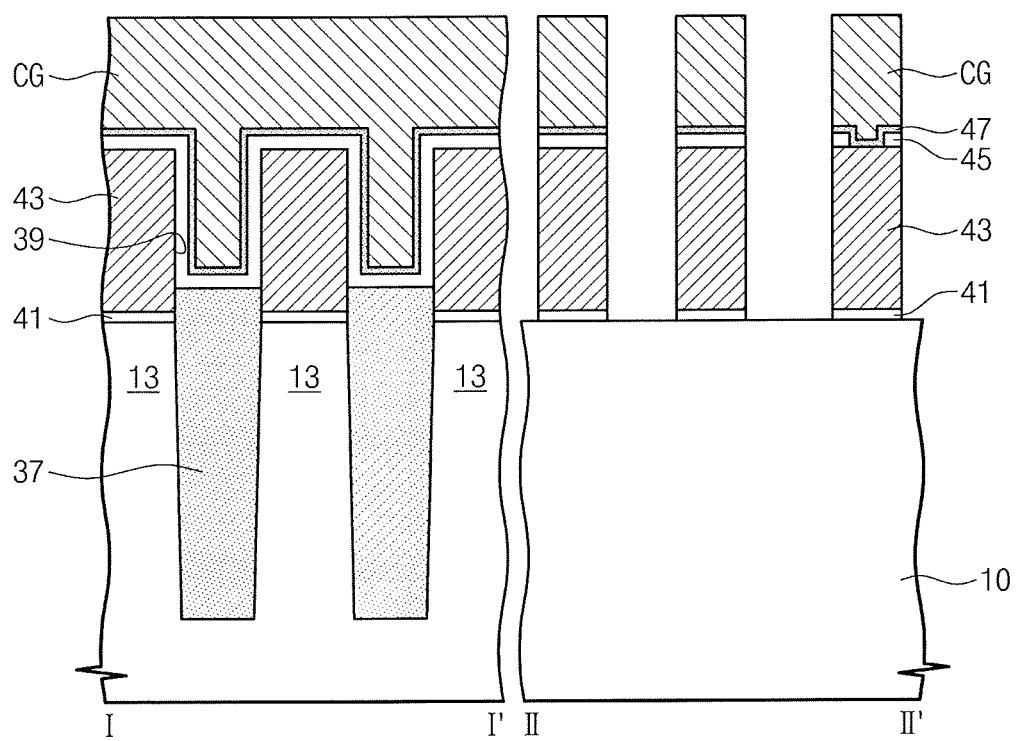

Referring to FIGS. 15 and 16, the silicon layer 49 is formed to fill the recess region 39 and the opening 46 without void and cutting. The silicon layer 49 may be patterned to form control gates CG extending, for example, in the second direction. The seed layer 47, the intergate insulating layer 45 and the floating gates 43 are also patterned in, for example, the second direction. The control gates CG may correspond to the word lines WL0 to WLn−1 and the selection lines GSL and SSL described with reference to FIG. 9.

Figure 17:
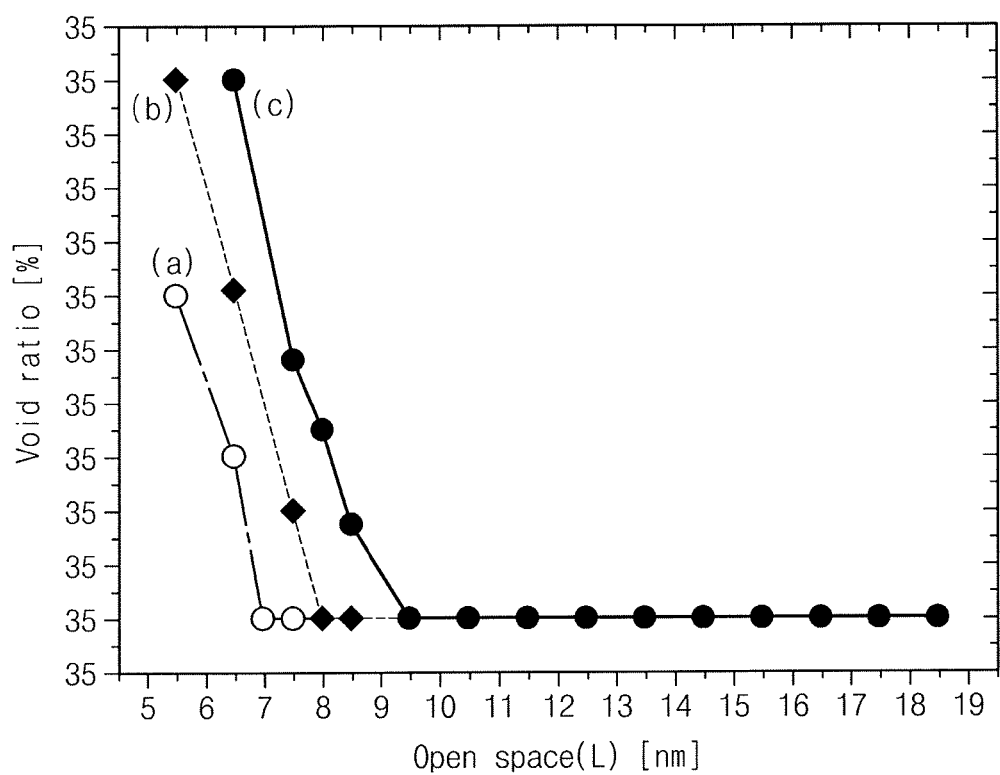
FIG. 17 shows filling characteristics of silicon layers according to an exemplary embodiment of the inventive concept.

FIG. 17 shows filling characteristics of silicon layers according to an exemplary embodiment of the inventive concept. A height of the sidewall of the recess region 39 was, for example, about 50 nm. As a space L between the floating gates 43 becomes reduced, a void (or cutting) may increase in the recess region 39. When $H_3SiN(CH(CH_3)_2)_2$ and $H_2Si(N(C_2H_5)_2)_2$ are used as the silicon precursors for the formation of the seed layer, the void (or cutting) does not occur until the spaces L between the patterns becomes reduced to, for example, about 7 nm and about 8 nm, respectively, as represented by designators (a) and (b) illustrated in FIG. 17. Alternatively, when a silicon layer is formed without the seed layer of an exemplary embodiment of the inventive concept, and if the space L between the patterns is reduced under, for example, about 10 nm, the void (or cutting) may occur as a designator (c) illustrated in FIG. 17.

Figure 18A:
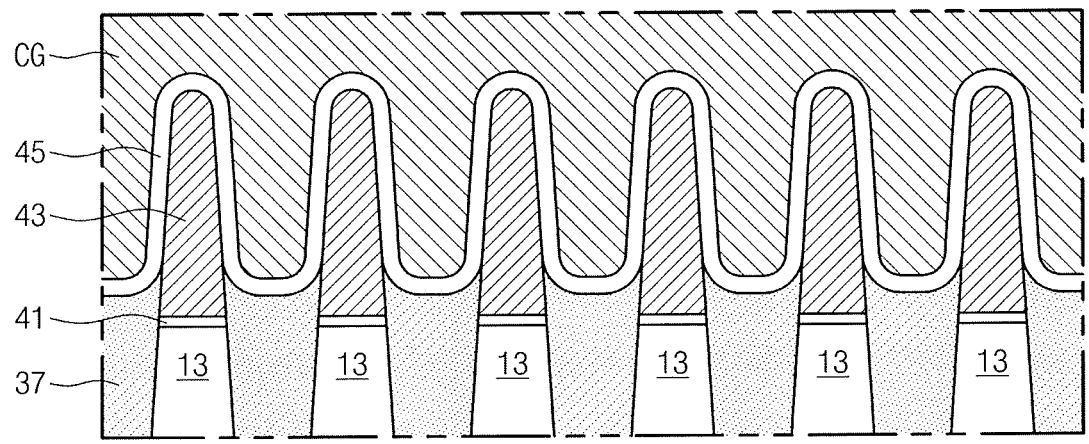
FIG. 18A is a cross-sectional view illustrating control gates of a NAND flash memory according to an exemplary embodiment of the inventive concept.
Figure 18B:
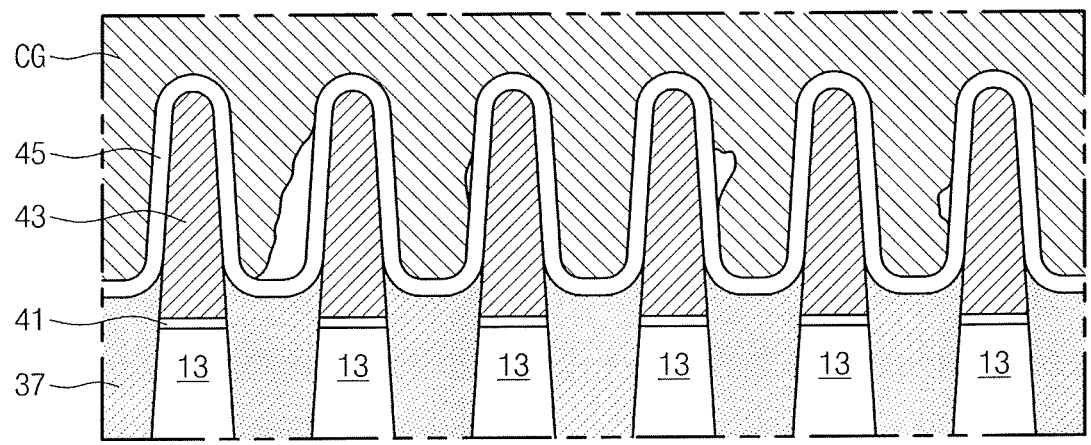
FIG. 18B is a cross-sectional view illustrating control gates of a NAND flash memory formed by a general deposition method.

FIGS. 18A and 18B show cross-sectional views of control gates CG of NAND flash memories corresponding to FIG. 16. FIG. 18A is a cross-sectional view illustrating control gates of a NAND flash memory according to an exemplary embodiment of the inventive concept, and FIG. 18B is a cross-sectional view illustrating control gates of a NAND flash memory formed by a general deposition method without the seed layer of the silicon monolayer. The space L between floating gates 43 was, for example, about 10 nm and a height of the floating gate 43 was, for example, about 50 nm. Cut portions were found in the control gates CG formed by the general deposition method as illustrated in FIG. 18B. Alternatively, the cutting was not found in the control gates CG formed by the method according to an exemplary embodiment of the inventive concept as illustrated in FIG. 18A.

A method of manufacturing a semiconductor device according to an exemplary e embodiment will be described with reference to the drawings.

Figure 19:
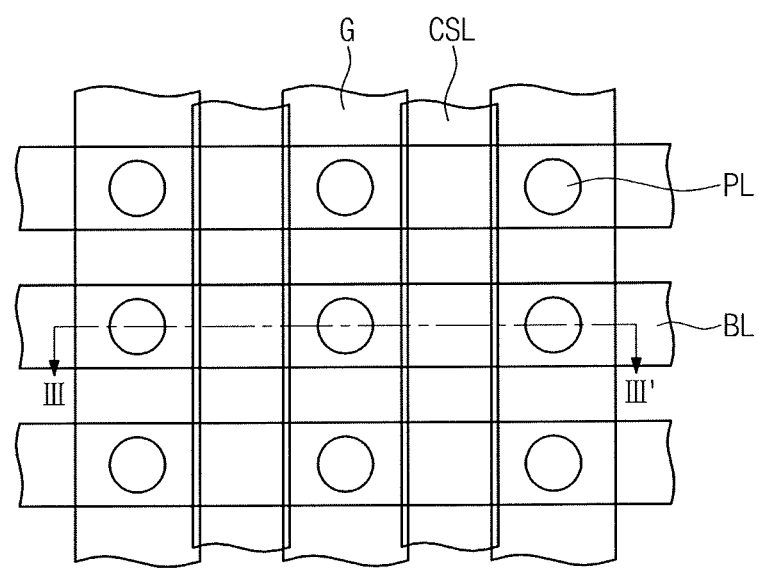
FIG. 19 is a layout of a semiconductor device according to an exemplary embodiment of the inventive concept.

FIG. 19 is a layout of a semiconductor device according to an exemplary embodiment of the inventive concept. As illustrated in FIG. 19, a memory cell of the semiconductor device may be, for example, a three-dimensional vertical NAND (VNAND) non-volatile memory cell.

Referring to FIG. 19, gate electrode stacks G may extend in, for example, a first direction. Common source lines CSL may be provided in the substrate between, for example, the gate electrode stacks G. Bit lines BL extend in, for example, a second direction crossing the first direction to cross over the gate electrode stacks G. Active pillars PL may be provided, for example, at crossing points of the gate electrode stacks G and the bit lines BL, respectively. The active pillars PL may extend, for example, in a direction vertical to the substrate (e.g. a direction perpendicular to the first and second directions).

FIGS. 20 to 22, 24 to 26, 28, and 29 are cross-sectional views illustrating a method of manufacturing a semiconductor device according to an exemplary embodiment of the inventive concept. FIG. 23 is an enlarged view of a portion 'A' of FIG. 22. FIG. 27 is an enlarged view of a portion 'B' of FIG. 26.

Figure 20:
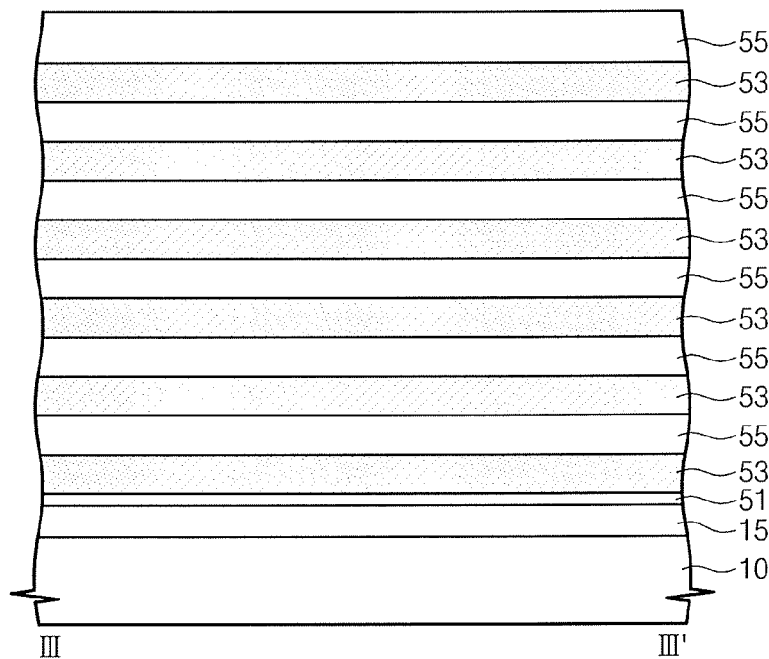
FIGS. 20 to 22, 24 to 26, 28, and 29 are cross-sectional views illustrating a method of manufacturing a semiconductor device according to an exemplary embodiment of the inventive concept.

Referring to FIG. 20, a substrate 10 is provided. Dopant ions of a first conductivity type may be provided into the substrate 10 to form a well 15. The well 15 may be formed by, for example, a dopant ion implantation process.

A buffer dielectric layer 51 may be formed on the substrate 10 having the well 15. For example, the buffer dielectric layer 51 may be a silicon oxide layer. The buffer dielectric layer 51 may be formed by, for example, a thermal oxidation process. First material layers 53 and second material layers 55 may be alternately formed on, for example, the buffer dielectric layer 51. The lowermost material layer contacting the buffer dielectric layer 51 may be the first material layer 53. The uppermost material layer may be the second material layer 55. The second material layers 55 may be insulating layers. For example, the second material layers 55 may include silicon oxide layers, respectively. The first material layers 53 may include, for example, a material having a wet etch selectivity with respect to the buffer dielectric layer 51 and the second material layers 55. For example, each of the first material layers 53 may include a silicon nitride layer or a silicon oxynitride layer. The first material layers 53 and the second material layers 55 may be formed by, for example, a chemical vapor deposition (CVD) method.

Figure 21:
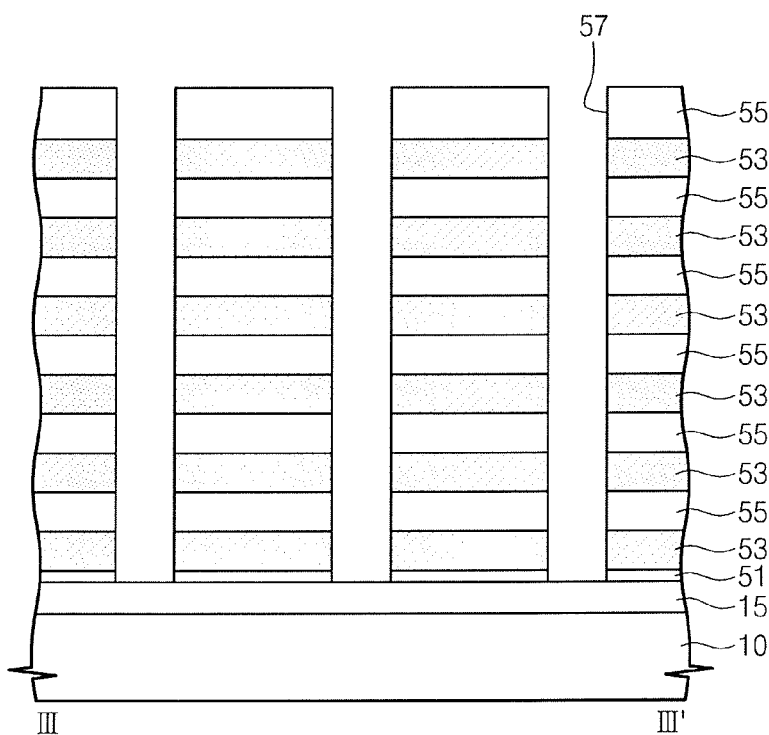

Referring to FIG. 21, channel holes 57 are formed to successively penetrate the buffer dielectric layer 51, the first material layers 53 and the second material layers 55. The channel holes 57 expose the substrate 10. The channel holes 57 may be arranged in, for example, matrix form along the first direction and the second direction. The first direction and the second direction may be, for example, parallel to the substrate 10 and be intercrossed.

Figure 22:
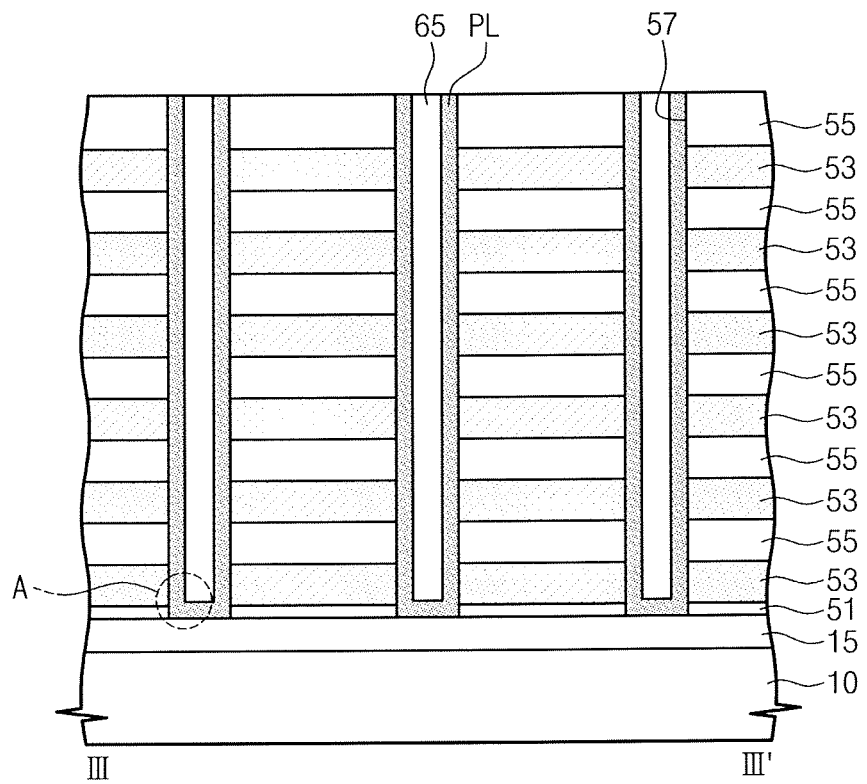
Figure 23:
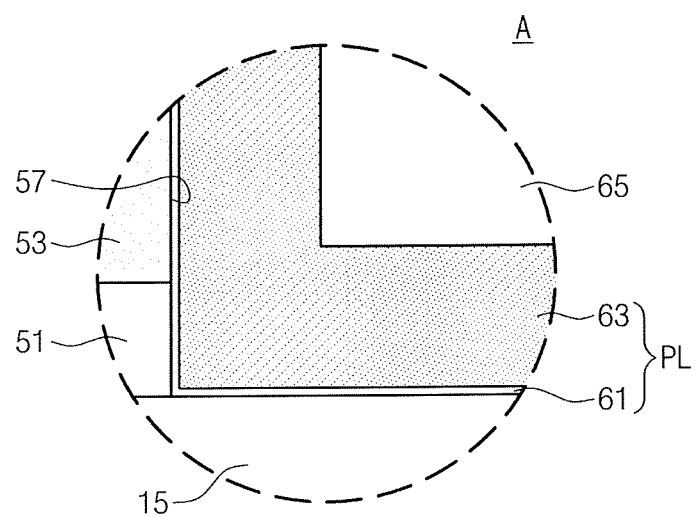
FIG. 23 is an enlarged view of a portion 'A' of FIG. 22.

Referring to FIGS. 22 and 23, active pillars PL connected to the substrate 10 are formed in the channel holes 57, respectively. The method of forming the active pillars PL will be described in more detail. A seed layer 61 and a silicon layer 63 are sequentially formed in the channel holes 57 using, for example, the method described with reference to FIGS. 2 to 4. As the silicon layer 63 is formed from the seed layer 61 of a silicon monolayer, the silicon layer 63 may be formed without void and cutting in the channel holes 57 having, for example, narrow widths. The seed layer 61 is formed along a profile of sidewalls and bottom surfaces of the channel holes 57.

For example, in an embodiment, the silicon layer 63 may partially fill the channel holes 57, and then an insulating material may be formed on the silicon layer 63 to completely fill the channel holes 57. The silicon layer 63 and the insulating material may be planarized to expose the uppermost second material layer 55. Thus, the active pillars PL having, for example, cylinder shapes may be formed, and a filling insulating layer 65 may fill the inside of the active pillar PL. In an embodiment, the silicon layer 63 may, for example, fully fill the channel holes 57. In this case, the filling insulating layer 65 may be omitted.

Figure 24:
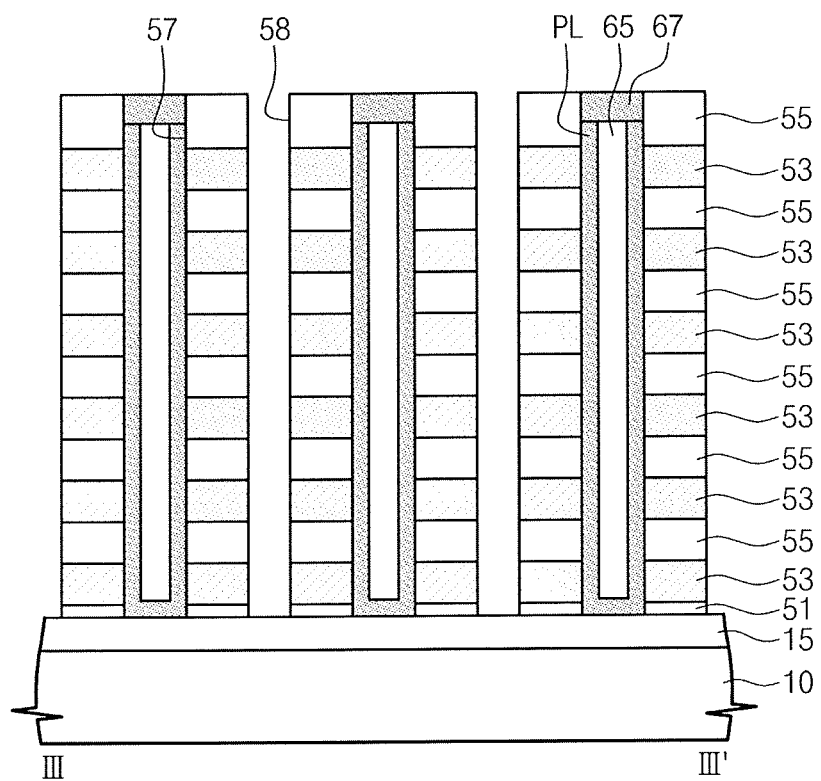

Referring to FIG. 24, upper portions of the active pillars PL may be, for example, recessed to be lower than a top surface of the uppermost second material layer 55. Capping semiconductor patterns 67 may be formed in the channel holes 57 on the recessed active pillars PL, respectively. For example, dopant ions of a second conductivity type may be injected into upper portions of the active pillars PL, thereby forming drain regions. At the same time, the dopant ions of the second conductivity type may be injected into the capping semiconductor patterns 67.

The first material layers 53 and the second material layers 55 may be successively patterned to form grooves 58 spaced apart from each other. The grooves 58 may be disposed, for example, between the active pillars PL to extend in the first direction.

Figure 25:
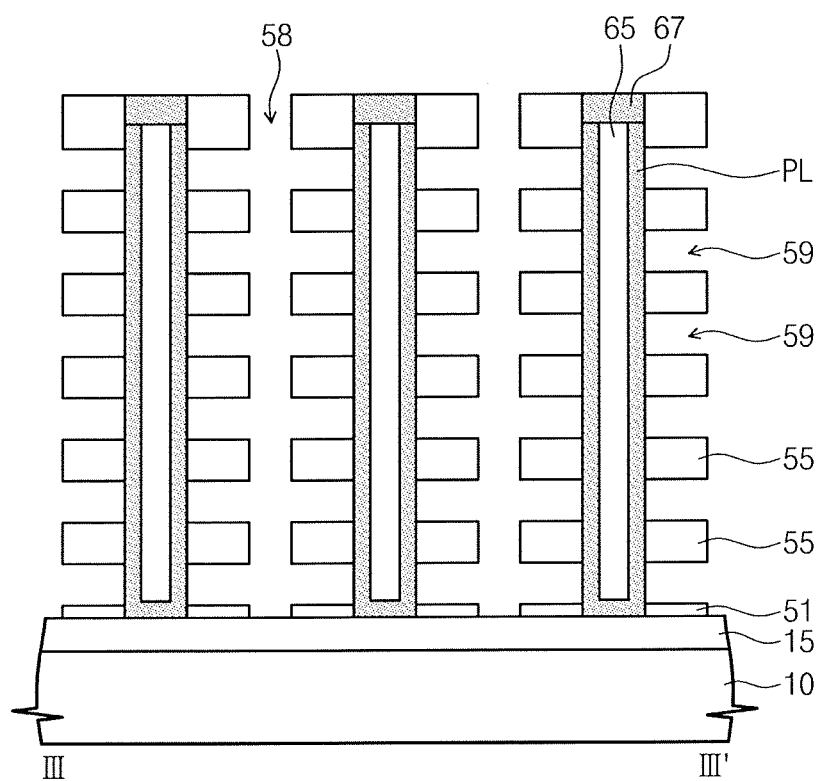

Referring to FIG. 25, the first material layers 53 exposed by the grooves 58 are selectively removed to form undercut regions 59. The undercut regions 59 correspond to regions where the first material layers 53 are removed. If the first material layers 53 are silicon nitride layers, the removal process may be performed using, for example, an etching solution including phosphoric acid. Portions of the sidewalls of the active pillars PL may be exposed by the undercut regions 59. The grooves 58 and the undercut regions 59 may correspond to the recess regions 5 described with reference to FIG. 1.

Figure 26:
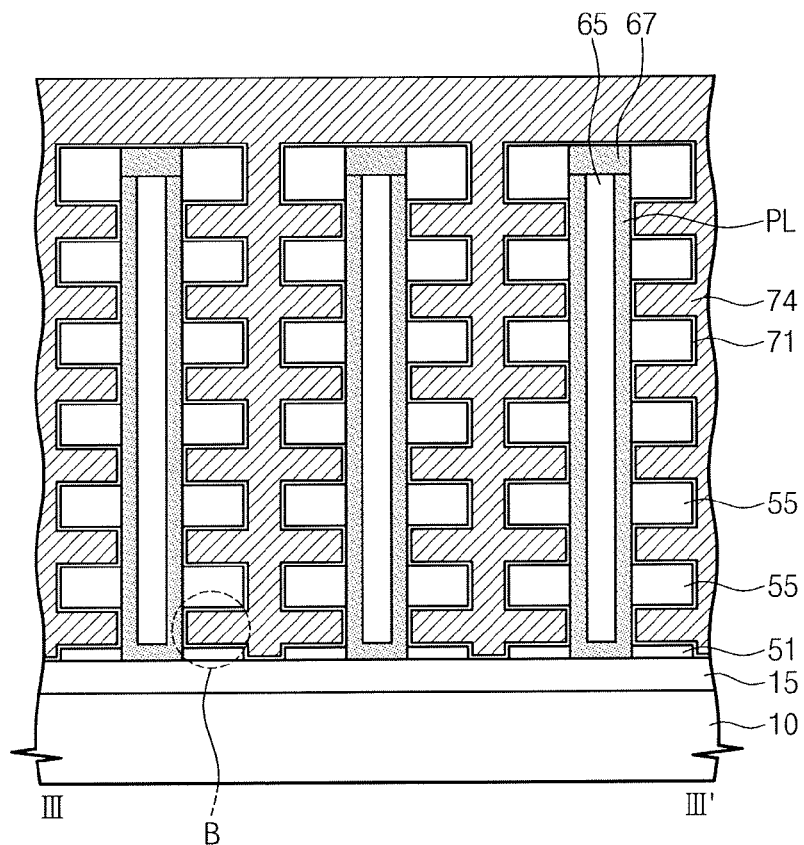
Figure 27:
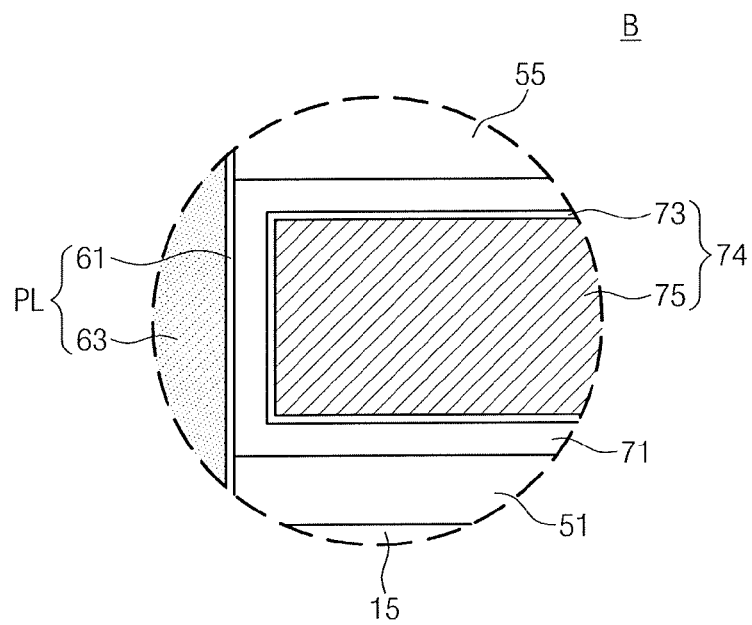
FIG. 27 is an enlarged view of a portion 'B' of FIG. 26.

Referring to FIGS. 26 and 27, a data storing layer 71 is conformally formed in the undercut regions 59. The data storing layer 71 may include, for example, a tunnel insulating layer contacting the active pillars PL, a charge storing layer on the tunnel insulating layer, and a blocking insulating layer on the charge storing layer. The tunnel insulating layer may include, for example, a silicon oxide layer. The tunnel insulating layer may be formed by, for example, thermally oxidizing the active pillars PL exposed by the undercut regions 59. Alternatively, the tunnel insulating layer may be formed by, for example, an atomic layer deposition (ALD) method. The charge storing layer may be, for example, a charge trap layer or an insulating layer including conductive nano particles. The charge trap layer may include, for example, a silicon nitride layer. The blocking insulating layer may include, for example, a high-k dielectric layer (e.g. an aluminum oxide layer or a hafnium oxide layer). The blocking insulating layer may be, for example, a multi-layer consisting of a plurality of thin layers. For example, the blocking insulating layer may include an aluminum oxide layer and a silicon oxide layer, and a stacking order of the aluminum oxide layer and the silicon oxide layer may be variously changed. The charge storing layer and the blocking insulating layer may be formed by, for example, an atomic layer deposition (ALD) method and/or a chemical vapor deposition (CVD) method having excellent step coverage.

A gate conductive layer 74 is formed on the data storing layer 71 to fill the undercut regions 59. The gate conductive layer 74 may partially or fully fill the grooves 58. The gate conductive layer 74 includes, for example, a seed layer 73 and a silicon layer 75 sequentially formed using, for example, the methods described with reference to FIGS. 2 to 4. As the silicon layer 75 is formed from the seed layer 73 of a silicon monolayer, the silicon layer 75 may be formed without void and cutting in the undercut regions 59. The seed layer 73 is formed along a profile of the undercut regions 59. The silicon layer 75 may be, for example, a doped silicon layer. The gate conductive layer 74 may further include, for example, at least one of tungsten, metal nitrides, and metal silicides. The silicon layer 75 may be formed by, for example, an atomic layer deposition (ALD) method.

Figure 28:
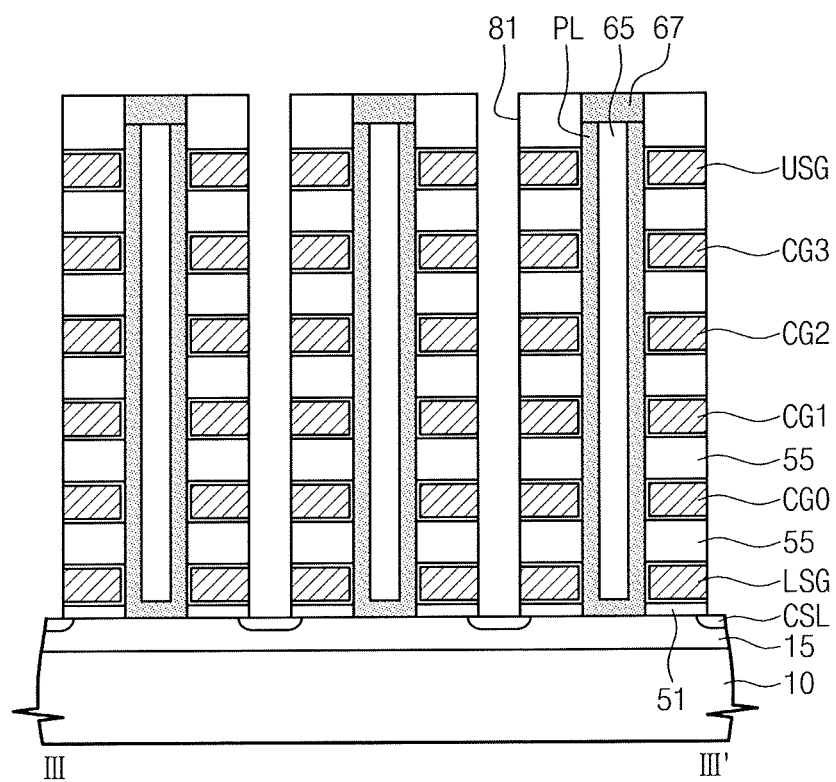

Referring to FIG. 28, the gate conductive layer 74 outside the undercut regions 59 is removed. Thus, gates are formed in the undercut regions 59, respectively. The gates may include, for example, an upper selection gate USG, control gates CG0 to CG3, and a lower selection gate LSG. For example, the gates USG, CG0 to CG3, and LSG may be included in the gate electrode stack. A plurality of the gate electrode stacks may be, for example, separated from each other by isolation regions 81 in the second direction. The isolation regions 81 may extend, for example, in the first direction. The gate conductive layer 74 in the grooves 58 is removed to expose the substrate 10. For example, dopant, ions of the second conductivity type may be provided into the exposed substrate 10 to form common source regions CSL. The second material layers 55 between the gates USG, CG0 to CG3, and LSG may function as intergate insulating layers.

Figure 29:
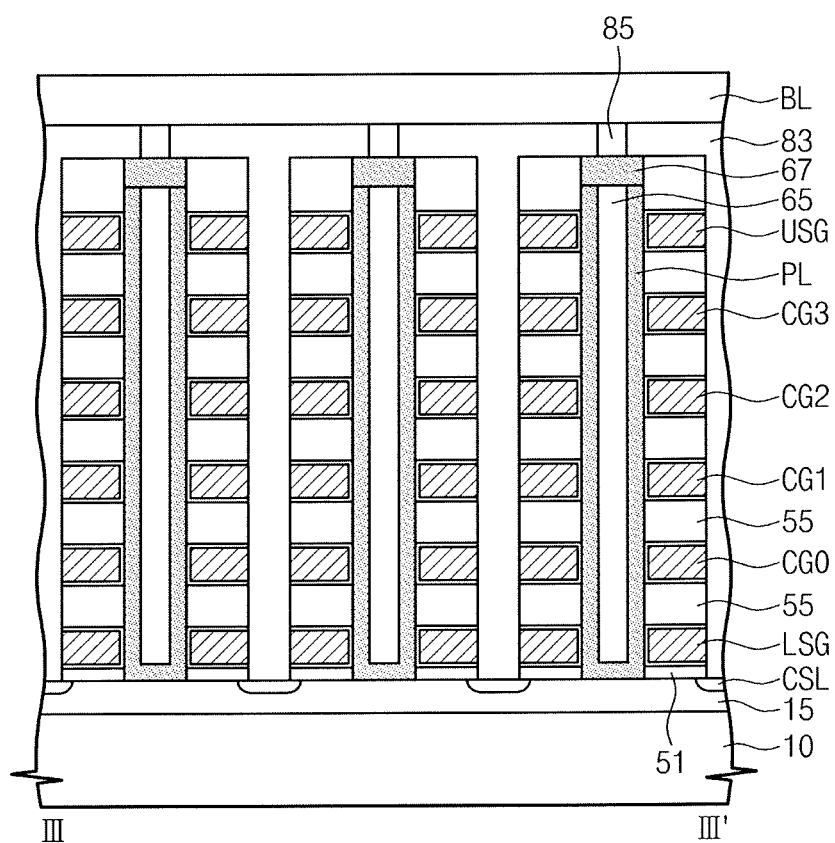

For example, referring to FIG. 29, an interlayer insulating layer 83 may fill the isolation regions 81. The interlayer insulating layer 83 may be formed of, for example, a silicon oxide layer. For example, conductive pillars 85 may be formed to penetrate the interlayer insulating layer 83. The conductive pillars 85 may be connected to, for example the capping semiconductor patterns 67, respectively. Bit lines BL extending, for example, in the second direction may be formed on the interlayer insulating layer 83 to be connected to the conductive pillars 85.

It is possible to apply the forming the silicon layer without void and cutting in the recess region and the undercut region by the aforementioned method of an exemplary embodiment of the inventive concept to various fields of semiconductor processes.

Figure 30:
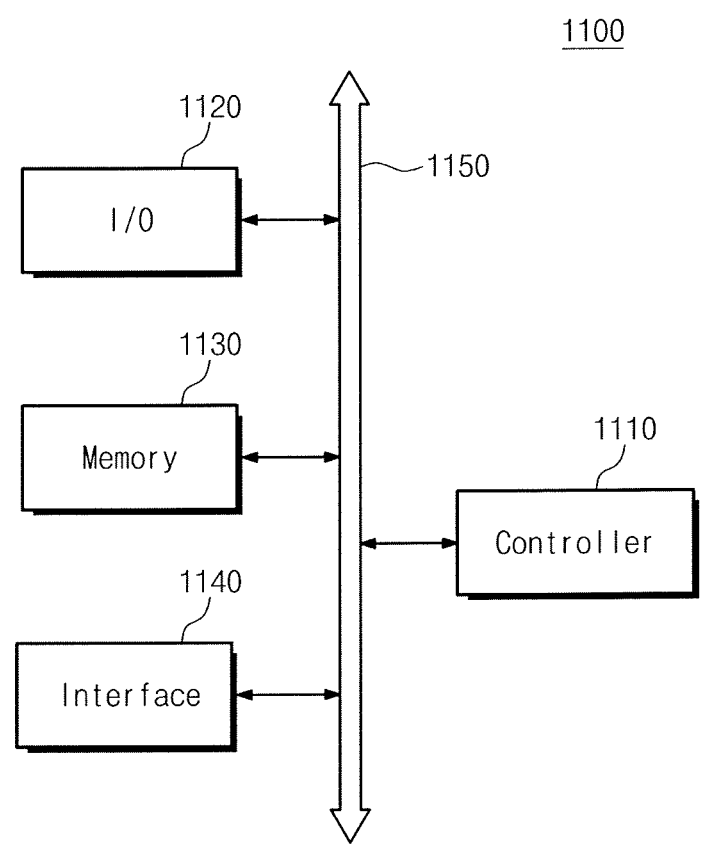
FIG. 30 is a schematic block diagram illustrating an example of memory systems including the semiconductor devices formed by an exemplary embodiment of the inventive concept.

FIG. 30 is a schematic block diagram illustrating an example of memory systems including the semiconductor devices formed by an exemplary embodiment of the inventive concept.

Referring to FIG. 30, an electronic system 1100 according to an exemplary embodiment of the inventive concept may include, for example, a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor device according to an exemplary embodiment of the inventive concept.

The controller 1110 may include, for example, at least one of a microprocessor, a digital signal processor, a microcontroller or another logic device. The other logic device may have a similar function to any one of the microprocessor, the digital signal processor and the microcontroller. The I/O unit 1120 may include, for example, a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for increasing an operation of the controller 1110.

The electronic system 1100 may be applied to, for example, a personal digital assistant (PDA), a portable computer, a web tablet, a wireless phone, a mobile phone, a digital music player, a memory card or other electronic products. The other electronic products may receive or transmit information data by wireless.

Figure 31:
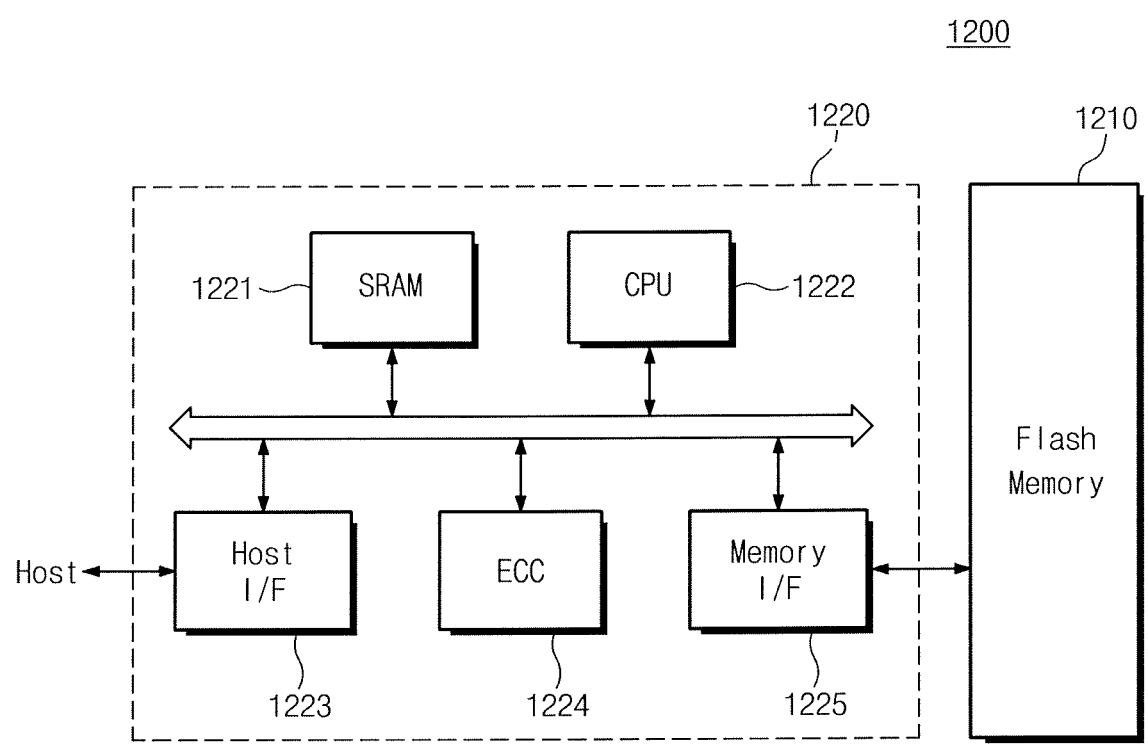
FIG. 31 is a schematic block diagram illustrating an example of memory cards including the semiconductor devices formed by an exemplary embodiment of the inventive concept.

FIG. 31 is a schematic block diagram illustrating an example of memory cards including the semiconductor devices formed by an exemplary embodiment of the inventive concept.

Referring to FIG. 31, a memory card 1200 may include, for example, a memory device 1210. The memory device 1210 may include at least one of the semiconductor devices according to an exemplary embodiment of the inventive concept mentioned above. In an embodiment, the memory device 1210 may further include, for example, other types of semiconductor memory devices which are different from the semiconductor devices according to an exemplary embodiment of the inventive concept described above. For example, the memory device 1210 may further include a dynamic random access memory (DRAM) device and/or a static random access memory (SRAM) device. The memory card 1200 may include, for example, a memory controller 1220 that controls data communication between a host and the memory device 1210. The memory device 1210 and/or the controller 1220 may include, for example, the semiconductor devices according to an exemplary embodiment of the inventive concept.

The memory controller 1220 may include, for example, a central processing unit (CPU) 1222 that controls overall operations of the memory card 1200. In addition, the memory controller 1220 may include, for example, an SRAM device 1221 used as an operation memory of the CPU 1222. Moreover, the memory controller 1220 may further include, for example, a host interface (IF) unit 1223 and a memory interface (IF) unit 1225. The host IF unit 1223 may be configured to include a data communication protocol between the memory card 1200 and the host. The memory IF unit 1225 may connect the memory controller 1220 to the memory device 1210. The memory controller 1220 may further include, for example, an error check and correction (ECC) block 1224. The ECC block 1224 may detect and correct errors of data which are read out from the memory device 1210. Even though not shown in the drawings, the memory card 1200 may further include, for example, a read only memory (ROM) device that stores code data to interface with the host. The memory card 1200 may be used as, for example, a portable data storage card. Alternatively, the memory card 1200 may realized as, for example, solid state disks (SSD) which are used as hard disks of computer systems.

Figure 32:
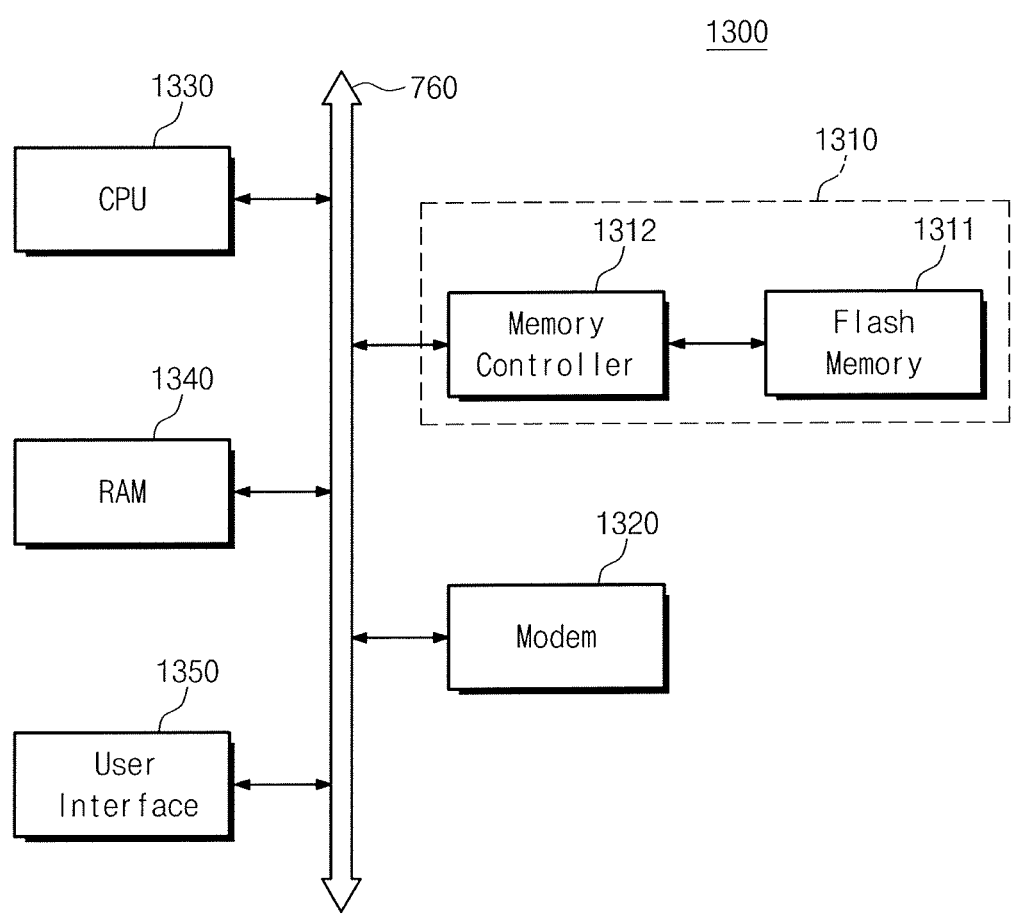
FIG. 32 is a schematic block diagram illustrating an example of data processing systems including the semiconductor devices formed by an exemplary embodiment of the inventive concept.

FIG. 32 is a schematic block diagram illustrating an example of data processing systems including the semiconductor devices formed by an exemplary embodiment of the inventive concept.

Referring to FIG. 32, a data processing system 1300 according to an exemplary embodiment of the inventive concept includes, for example, a modulator-demodulator (MODEM) 1320, a central processing unit (CPU) 1330, a random access memory (RAM) device 1340 and a user interface unit 1350 that are electrically connected to a flash memory system 1310 through a data bus 760. The flash memory system 1310 may have, for example, substantially the same configuration as the memory system described above. For example, the flash memory system 1310 may include a flash memory 1311 and a memory controller 1312. The flash memory system 1310 may store data processed by the CPU 1330 or data transmitted from an external system. Here, the flash memory system 1310 may be realized as, for example, a solid state drive (SSD). In this case, the data processing system 1300 may stably and reliably store massive data into the flash memory system 1310. Additionally, due to increased reliability, the flash memory system 1310 may reduce a resource for correcting errors to provide data communication of high speed to the data processing system 1300. Although not shown in the drawings, the data processing system 1300 may further include, for example, an application chipset, a camera image processor (CIS), and/or an input/output unit.

Additionally, the semiconductor devices or the memory systems according to an exemplary embodiment of the inventive concept may be encapsulated using various packaging techniques. For example, the semiconductor devices or the memory systems according to an exemplary embodiment may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

According to an exemplary embodiment of the inventive concept, the silicon layer may fill without void and cutting in the narrow recess regions between patterns.

Having described exemplary embodiments of the inventive concept, it is further noted that it is readily apparent to those of ordinary skill in the art that various modifications may be made without departing from the spirit and scope of the invention which defined by the metes and bounds of the appended claims.

What is claimed is:

1. A method of manufacturing a semiconductor device, comprising:
   forming a plurality of patterns having a recess region defined therebetween on a substrate;
   forming a silicon monolayer on the patterns having the recess region defined therebetween by providing a silicon precursor having an organic ligand on the substrate to absorb silicon on sidewalls and a bottom surface of the recess region; and
   forming a silicon layer without void and cutting on the silicon monolayer.

2. The method of claim 1, wherein a space between the sidewalls of the recess region is no greater than about 10 nm.

3. The method of claim 1, wherein the silicon precursor having the organic ligand is one of $H_3SiN(CH(CH_3)_2)_2$, $H_2Si(N(C_2H_5)_2)_2$, $H_2Si(NHC(CH_3)_3)_2$, or $H_2Si(N(C_2H_5)(CH_3))_2$.

4. The method of claim 1, wherein the forming of the silicon monolayer is performed at a substrate temperature of no greater than about 500 degrees Celsius.

5. The method of claim 1, wherein the forming of the patterns comprises:
   forming a plurality of device isolation members on the substrate to define a plurality of active regions;
   sequentially forming a tunnel insulating layer and a floating gate on each of the active regions, wherein top surfaces of the device isolation members are lower than top surfaces of the floating gates; and
   forming an intergate insulating layer on the floating gates, wherein the intergate insulating layer extend onto the top surface of the device isolation members.

6. The method of claim 1, wherein the forming of the patterns comprises etching the substrate to form the recess region in the substrate; and
   wherein the silicon monolayer is formed along a profile of the sidewalls and the bottom surface of the recess region.

7. The method of claim 1, wherein the forming of the silicon layer further comprises growing the silicon layer from the silicon monolayer to fill the recess region without void and cutting.

8. The method of claim 4, wherein the forming of the silicon monolayer further comprises purging residues after providing the silicon precursor.

9. The method of claim 5, wherein the silicon monolayer is formed along a profile of the intergate insulating layer.

10. The method of claim 5, wherein the intergate insulating layer has an opening exposing one of the floating gates; and
    wherein the silicon monolayer is formed along a profile of the opening, and wherein the silicon layer fills the opening without void and cutting.

11. The method of claim 9, wherein the recess region is disposed between the floating gates; and
    wherein the silicon layer without void and cutting fills the recess region between the floating gates.

12. The method of claim 6, wherein the silicon layer fills a lower portion of the recess region,
    the method, further comprising:
    injecting dopant ions into regions of the substrate divided by the recess region to form source/drain regions.

13. The method of claim 6, wherein the forming of the patterns further comprises forming an undercut region extending from the recess region in a direction parallel to a top surface of the substrate; and
    wherein the silicon monolayer and the silicon layer are formed along a profile of sidewalls of the recess region and the undercut region.

14. A method of manufacturing a semiconductor device, comprising:
    alternately stacking a plurality of first material layers and a plurality of second material layers on a substrate;
    forming a plurality of channel holes penetrating the first material layers and the second material layers, wherein the channel holes expose the substrate;
    forming a first silicon monolayer along a profile of the exposed substrate and sidewalls of the channel holes by providing a silicon precursor having an organic ligand on the substrate to absorb silicon on the sidewalls of the channel holes and the exposed substrate; and
    forming a first silicon layer without void and cutting on the first silicon monolayer to form a plurality of active pillars.

15. The method of claim 14, further comprising:
etching the first material layers and the second material layers to form a groove between the channel holes;
selectively removing the first material layers exposed by the groove to form undercut regions exposing the active pillars and top surfaces and bottom surfaces of the second material layers, wherein the undercut regions extend from the groove toward the active pillars;
forming a data storing layer on the exposed active pillars and the exposed top surfaces and bottom surfaces of the second material layers;
forming a second silicon monolayer on the data storing layer by providing a silicon precursor having an organic ligand on the data storing layer to absorb silicon on a surface of the data storing layer; and
forming a second silicon layer without void and cutting on the second silicon monolayer to fill the undercut regions.

16. The method of claim 15, further comprising:
removing the second silicon layer formed in the groove to form gates in the undercut regions, respectively.

17. The method of claim 16, further comprising providing dopant ions into a portion of the substrate exposed by the removal of the second silicon layer from the groove to form common sources regions.

18. The method of claim 17, further comprising:
filling isolation regions defined between the gates with an interlayer insulating layer;
forming conductive pillars penetrating the interlayer insulating layer; and
forming bit lines on the interlayer insulating layer, wherein the bit lines are connected to the conductive pillars.

19. A method for manufacturing a semiconductor device comprising:
forming a groove in a substrate extending in a direction parallel to a top surface of the substrate, thereby defining a plurality of regions in the substrate which are divided by the groove;
forming an undercut region extending from a lower area of the groove in the direction parallel to the top surface of the substrate;
forming a gate insulating layer on sidewalls of the groove and sidewalls and a bottom surface of the undercut region;
forming a seed layer of a silicon monolayer on the gate insulating layer by providing a silicon precursor including an organic ligand on the gate insulating layer to absorb silicon on a surface of the gate insulating layer;
forming a silicon layer on the seed layer, wherein the silicon layer grows from the seed layer of the silicon monolayer to fill the groove without void and cutting;
removing a portion of the silicon layer and the seed layer in an upper portion of the groove;
forming a capping layer in the upper portion of the groove; and
providing dopant ions into the regions of the substrate divided by the groove, thereby forming source/drain regions.

20. The method of claim 19, wherein the seed layer of the silicon monolayer and the silicon layer are formed along the sidewalls of the groove and a profile of the undercut region, and wherein the gate insulating layer is formed by performing a thermal oxidation process on the substrate.

* * * * *